US009029829B1

(12) United States Patent
Echeverry et al.

(10) Patent No.: US 9,029,829 B1
(45) Date of Patent: May 12, 2015

(54) RESISTIVE SWITCHING MEMORIES

(75) Inventors: Juan Pablo Saenz Echeverry, Mountain View, CA (US); Deepak Kamalanathan, Santa Clara, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 430 days.

(21) Appl. No.: 13/462,659

(22) Filed: May 2, 2012

(51) Int. Cl.
*H01L 27/24* (2006.01)
*G11C 5/06* (2006.01)

(52) U.S. Cl.
CPC .............. *H01L 27/2463* (2013.01); *G11C 5/06* (2013.01)

(58) Field of Classification Search
CPC ............ H01L 27/2436; H01L 27/2463; H01L 27/2472; H01L 45/04; H01L 45/12; H01L 45/1253; G11C 5/06; G11C 5/063; G11C 13/0002; G11C 14/0045; G11C 14/009
USPC ........... 257/2–5, E27.004, E45.002, E45.003; 365/63, 148
See application file for complete search history.

(56) References Cited

U.S. PATENT DOCUMENTS

| | | | |
|---|---|---|---|
| 6,590,797 B1 * | 7/2003 | Nachumovsky et al. ........ 365/96 |
| 7,164,599 B2 * | 1/2007 | Hosotani et al. .............. 365/158 |
| 7,215,568 B2 * | 5/2007 | Liaw et al. .................... 365/148 |
| 7,292,469 B2 | 11/2007 | Lee et al. | |
| 7,372,716 B2 | 5/2008 | Roehr et al. | |
| 7,440,308 B2 * | 10/2008 | Jeong et al. ................... 365/148 |
| 7,463,502 B2 * | 12/2008 | Stipe .............................. 365/65 |
| 7,495,947 B2 * | 2/2009 | Scheuerlein et al. ......... 365/148 |
| 7,684,227 B2 * | 3/2010 | Liu et al. ....................... 365/148 |
| 7,888,228 B2 | 2/2011 | Blanchard | |
| 7,961,534 B2 * | 6/2011 | Kang et al. ................... 365/193 |
| 8,331,128 B1 * | 12/2012 | Derhacobian et al. ........ 365/148 |
| 2004/0165461 A1 * | 8/2004 | Nejad et al. ................... 365/203 |
| 2007/0159867 A1 * | 7/2007 | Muraoka et al. .............. 365/100 |
| 2008/0217670 A1 | 9/2008 | Dahmani | |
| 2009/0268505 A1 * | 10/2009 | Beer ............................. 365/148 |
| 2010/0258779 A1 * | 10/2010 | Mikawa et al. ................... 257/2 |

OTHER PUBLICATIONS

Chen, A., "Status and Challenges in Ionic Memories," Strategic Technology Group, AMD, Nov. 12, 2008, 34 pages.
Jo, S.H., "Nanoscale Memristive Devices for Memory and Logic Applications," Dissertation submitted in partial fulfillment of the requirements for the degree of Doctor Philosphy, University of Michigan, 2010, 153 pages.
Hisashi, S., et al., "Basics of RRAM based on transition metal oxides," International Symposium on Advanced Gate Stack Technoloy, Sep. 29-Oct. 1, 2010, 25 pages.
Kamalanathan, D., "Kinetics of Programmable Metallization Cell Memory," A Dissertation Presented in Partial Fulfillment of the Requirements for the Degree Doctor of Philosophy, Arizona State University, May 2011, 140 pages.
Kozicki, M. N., et al., "Non-Volatile Memory Based on Solid Electrolytes," Non-Volatile Memory Technology Symposium, 2004, 8 pages.

(Continued)

*Primary Examiner* — Allison P Bernstein
(74) *Attorney, Agent, or Firm* — Slater & Matsil, L.L.P.

(57) ABSTRACT

A memory cell includes a first resistive switching device having a first terminal and a second terminal, a switching device having a first terminal and a second terminal, and an access device having a first access terminal and a second access terminal. The first access terminal is coupled to the first terminal of the first resistive switching device and the first terminal of the switching device.

26 Claims, 29 Drawing Sheets

(56) References Cited

OTHER PUBLICATIONS

Kozicki, M., "Programmable Metallization Cell: From Academic Research to a Market Place," Axon Technologies, 1 page.

Valov, I., et al., "Electrochemical Metallization memories-fundamentals, applications, prospects," Nanotechnology, 2011, 22 pages.

Wong, H.-S. P., "Emerging Memories," Center for Integrated Systems, Stanford University, Apr. 3, 2008, 77 pages.

Wong, H.-S. P., "Phase Change Memory," Proceedings of the IEEE, vol. 98, No. 12, Dec. 2010, pp. 2201-2227.

\* cited by examiner

| $V_{PROG}$ | FIRST MEMORY UNIT R11 | SECOND MEMORY UNIT R21 |
|---|---|---|
| $V_1$ | OFF | OFF |
| STATE | I | |
| $V_2$ | ON | OFF |
| STATE | II | |
| $V_3$ | ON | ON |
| STATE | III | |

*FIG. 9E*

RESISTIVE SWITCHING MEMORIES

TECHNICAL FIELD

The present invention relates generally to memory devices, and more particularly to resistive switching memories.

BACKGROUND

Semiconductor industry relies on device scaling to deliver improved performance at lower costs. Flash memory is the mainstream non-volatile memory in today's market. However, Flash memory has a number of limitations that is posing a significant threat to continued advancement of memory technology. Therefore, the industry is exploring alternative memories to replace Flash memory. Contenders for future memory technology include magnetic storage random access memory (MRAM), ferroelectric RAM (FeRAM), and resistive switching memories such as phase change RAM (PCRAM), metal oxide based memories, and programmable metallization cell (PMC) or ionic memories. These memories are also called as emerging memories.

To be viable, the emerging memory has to be better than Flash memory in more than one of technology metrics such as scalability, performance, energy efficiency, On/Off ratio, operational temperature, CMOS compatibility, and reliability.

SUMMARY OF THE INVENTION

These and other problems are generally solved or circumvented, and technical advantages are generally achieved, by illustrative embodiments of the present invention.

In accordance with an embodiment of the present invention, a memory cell comprises a first resistive switching device having a first terminal and a second terminal, a switching device having a first terminal and a second terminal, and an access device having a first access terminal and a second access terminal. The first access terminal is coupled to the first terminal of the first resistive switching device and the first terminal of the switching device.

In accordance with an alternative embodiment of the present invention, a resistive switching device comprises a common electrode, a first variable impedance region, a second variable impedance region, and a first electrode. The common electrode is disposed within a first insulating layer. The first variable impedance region is disposed within a second insulating layer. The second insulating layer is disposed over the first insulating layer. The second variable impedance region is disposed within the second insulating layer. The first electrode is disposed within a third insulating layer, the third insulating layer disposed over the second insulating layer. The first and the second variable impedance regions are coupled between the first electrode and the common electrode.

In accordance with an alternative embodiment of the present invention, a resistive switching device comprises a common electrode, a first variable impedance region, a second variable impedance region, a first electrode, and a second electrode. The common electrode is disposed within a first insulating layer. The first variable impedance region is disposed within a second insulating layer. The second insulating layer is disposed over the first insulating layer. The second variable impedance region is disposed within the second insulating layer. The first electrode is disposed within a third insulating layer. The third insulating layer is disposed over the second insulating layer. The second electrode is disposed within the third insulating layer. The first variable impedance region is coupled between the first electrode and the common electrode. The second variable impedance region is coupled between the second electrode and the common electrode.

In accordance with yet an alternative embodiment of the present invention, a resistive switching device comprises a first electrode disposed within a first insulating layer. A first variable impedance region is disposed within a second insulating layer. The second insulating layer disposed over the first insulating layer. A second electrode is disposed within a third insulating layer. The third insulating layer is disposed over the second insulating layer. The first variable impedance region is coupled between the first and the second electrodes. The second variable impedance region is disposed within a fourth insulating layer. The fourth insulating layer is disposed over the third insulating layer. The third electrode is disposed within a fifth insulating layer. The fifth insulating layer is disposed over the fourth insulating layer. The second variable impedance region is coupled between the second and the third electrodes. The resistive switching device further comprises an access device disposed under the first electrode, the access device being coupled to the second electrode.

The foregoing has outlined rather broadly the features of an embodiment of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIG. 1, which includes

FIG. 6, which includes FIGS. 6A and 6B, illustrate different embodiments of implementing the circuit illustrated in FIG. 5, wherein FIG. 6A illustrates a normal cell while FIG. 6B illustrates an inverted cell;

FIG. 9, which includes FIGS. 9A-9E, illustrates a multi-bit memory cell in accordance with embodiments of the invention, wherein FIGS. 9A and 9B illustrate circuit schematics of the memory cell, wherein FIGS. 9C and 9D illustrate impedance states of the memory cell, and wherein FIG. 9E illustrates a representative operation of the multi-bit memory cell;

FIG. 10, which includes

FIG. 16, which includes

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION OF ILLUSTRATIVE EMBODIMENTS

The making and using of various embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to various embodiments in a specific context, namely ionic memories such as programmable metallization cells (also called as conductive bridging memories, nanobridge memories, or electrolytic memories). The invention may also be applied, however, to other types of memories, particularly, to any resistive memory such as two terminal resistive memories. Although described herein for a memory device, the embodiments of the invention may also be applied to other types of devices formed by resistive switching such as processors, dynamically-reroutable electronics, optical switches, field-programmable gate arrays, and microfluidic valves as well as other nanoionic devices.

Figure 1A:
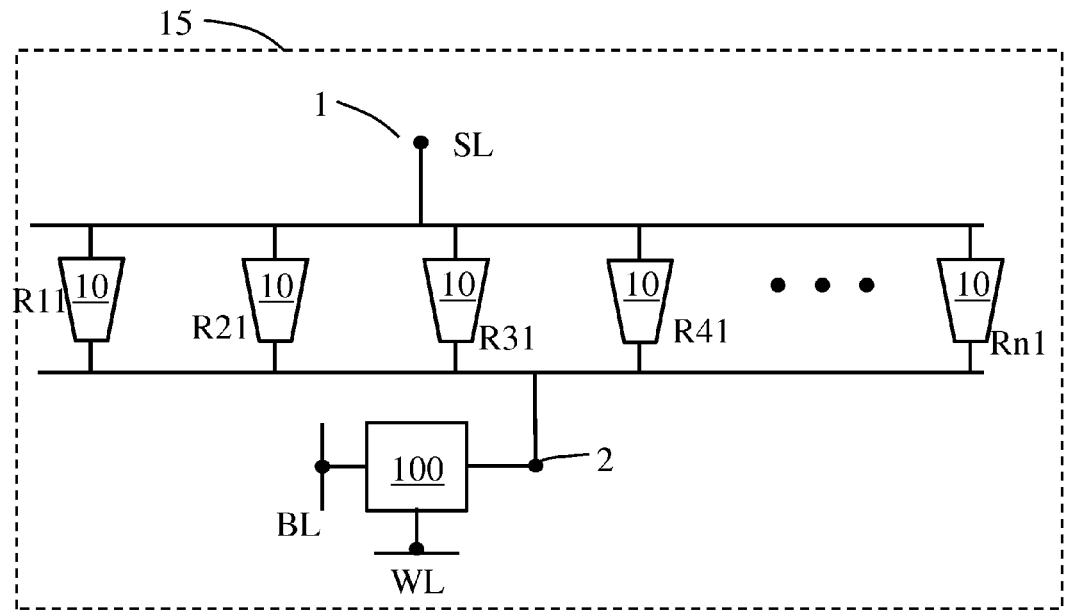
FIGS. 1A-1C, illustrates a schematic of a memory device and operational states in accordance with embodiments of the invention.
Figure 1C:
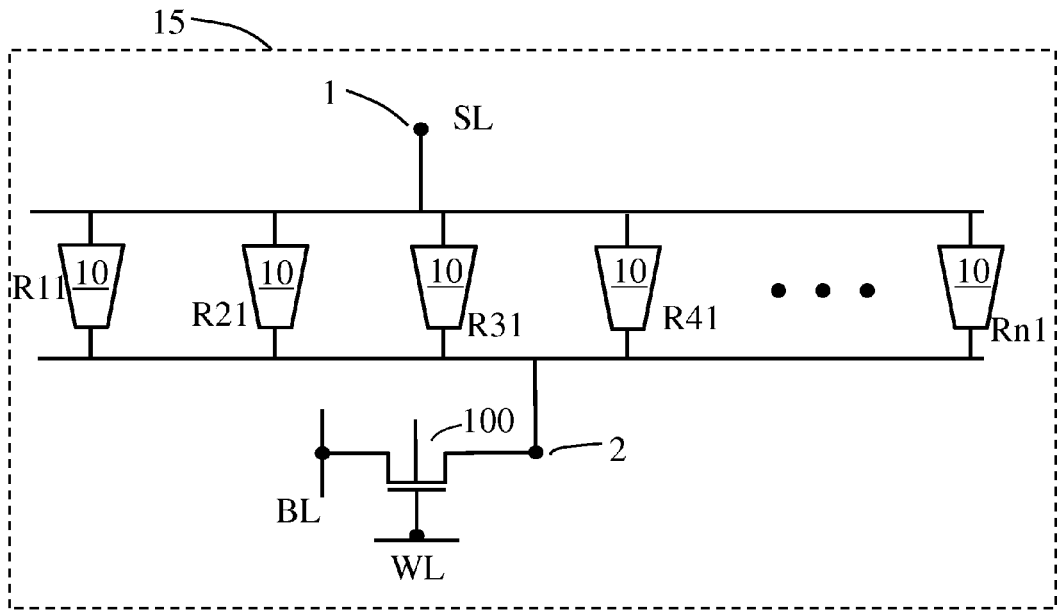
Figure 1B:
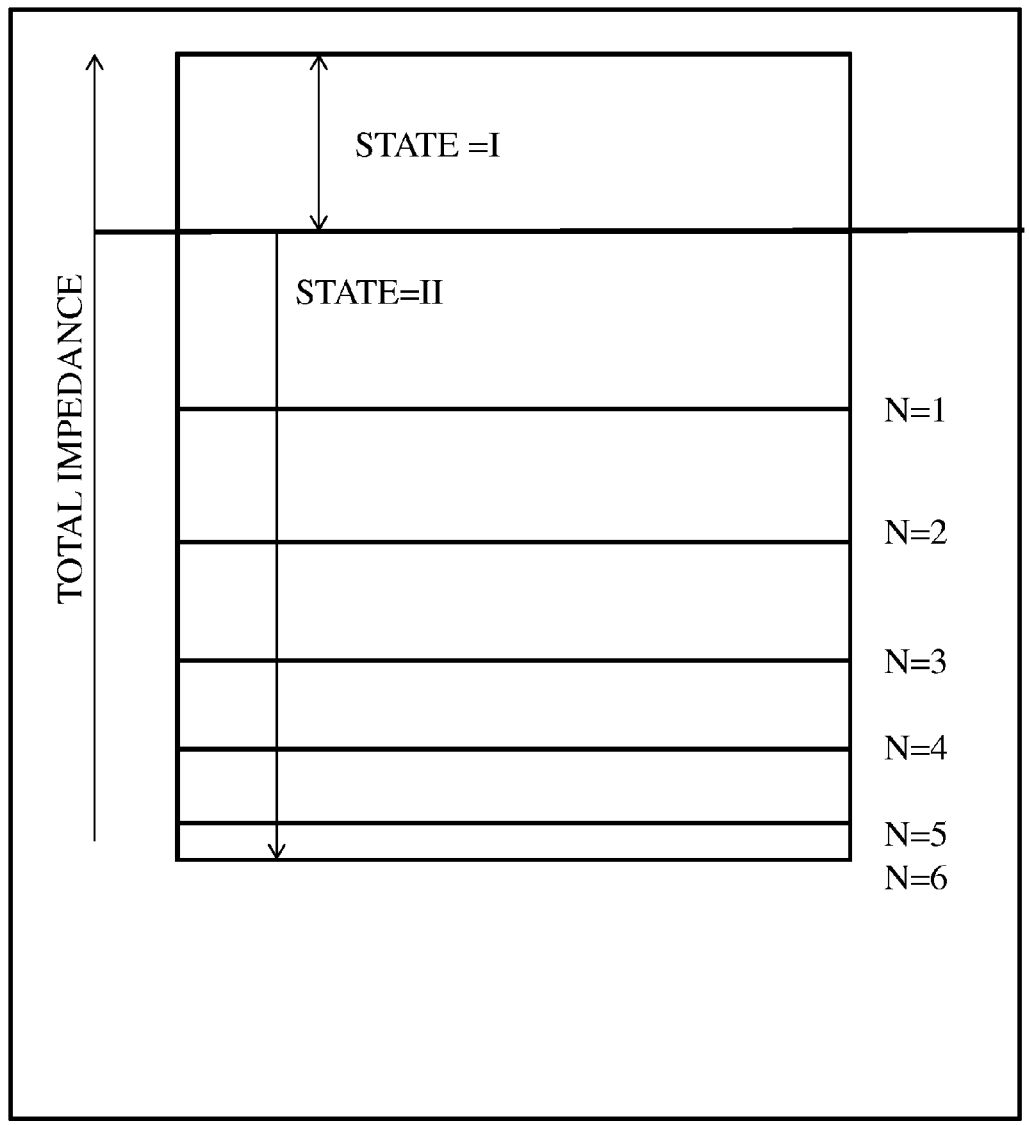

FIG. 1, which includes FIGS. 1A-1C, illustrates a schematic of a memory device and operational states in accordance with embodiments of the invention, wherein FIGS. 1A and 1C illustrate schematic circuit diagrams and FIG. 1B illustrates states of the memory device.

Referring to FIG. 1A, the memory cell 15 may be a 1-access device N-memory unit (1-AD N-MU) memory cell in one embodiment. The memory cell 15 may be connected through a word line WL, a bit line BL, and a select line SL to form part of a memory array. A memory cell 15 comprises a plurality of memory units 10, which are coupled in parallel between a first node 1 (e.g., anode node) and a second node 2 (e.g., cathode node).

The plurality of memory units 10 may comprise resistive switching memories that switch based on thermal, electronic, and/or ionic effects. Each memory of the plurality of memory units 10 may comprise an ionic memory in one or more embodiments. Such ionic memory may involve cells based on anion migration or cation migration. An example of an ionic memory includes a conductive bridging random access memory. Each of the plurality of memory units 10 may comprise a RRAM, which switch based on electronic effects, e.g., based on metal oxides in some embodiments. Each one of the plurality of memory units 10 may switch based on thermal effects and may comprise a phase change memory unit in alternative embodiments.

In various embodiments, each of the plurality of memory units 10 comprises a separate resistive switching device. As illustrated in FIG. 1A, the plurality of memory units 10 comprises a first memory unit R11, a second memory unit R21, a third memory unit R31, a fourth memory unit R41, ending with a nth memory unit Rn1. In various embodiments, each memory unit of the plurality of memory units 10 may comprise a same median impedance so that at least one of the other memory units in parallel forms a redundant memory unit. In an alternative embodiment, as will be described further below, the memory units of the plurality of memory units 10 may be grouped into a different grouping of median impedances so as to form a multi-bit memory array.

An access device 100 is coupled to the plurality of memory units 10 through the second node 2. In various embodiments, the access device 100 may comprise a switching device. In one embodiment, the access device 100 is a diode. In an alternate embodiment, the access device 100 is a transistor.

The plurality of memory units 10 are coupled to a bit line BL through the access device 100. The access device 100 may provide a conductive path from the second node 2 to the bit line BL. The access device 100 may be enabled or controlled using the word line WL (as well as the bit line BL and the select line SL).

The word line WL may be coupled to a word line drive (WLD), which may be commonly shared with a plurality of memory cells sharing a common word line WL. Similarly, the bit line BL may be coupled or driven by a bit line driver BLD and the select line SL may be coupled to a select line driver SLD. The BLD and the SLD may be commonly shared over a plurality of memory cells sharing a common bit line or a common select line.

In one embodiment, the memory cell has two states: a high impedance state and a low impedance state. The resistivity state of the memory cell can be read by applying a read voltage between the first and the second nodes 1 and 2. The read voltage is negligible compared to the programming and erase voltages (typically about −200 mV to about 200 mV) and does not change the state of the memory cell.

The plurality of memory units 10 may be erased, programmed, and/or read in parallel in one or more embodiments. Advantageously, the plurality of memory units 10 ensures redundancy. For example, the effective impedance of the plurality of memory units 10 decreases as a function of the redundancy factor N. The redundancy also improves operating stability and retention. For example, the memory cell may be more stable over a wider temperature range.

FIG. 1B illustrates the benefit of using additional memory units as described in various embodiments. In various embodiments, the total impedance of the plurality of memory units 10 is a function of the redundancy factor N as illustrated in FIG. 1B. The total impedance of the plurality of memory units 10 decreases continuously with increasing number of memory units. However, the threshold impedance, which is the boundary between a high impedance state (STATE=I) and a low impedance state (STATE=II) is independent of the number of memory units. In other words, during a read operation, if the total impedance of the cell is higher than this threshold, the memory cell comprising the plurality of memory units 10 is in a high impedance state. In contrast, if the total impedance of the cell is lower than this threshold, the memory cell comprising the plurality of memory units 10 is in a low impedance state. As illustrated in FIG. 1B, a change the number of resistors has no impact on the read state. Embodiments of the invention take advantage of this behavior so that even if one of the memory units programs correctly into the low impedance state, the memory cell is read as being in a low impedance state. This allows room for some of the memory units to fail without impacting the overall performance of the memory cell.

Thus, the memory cell achieves an N-level redundancy without using N number of access devices, which consume costly real estate on the chip. Advantageously, the redundancy may be obtained without increasing the chip area as the memory units of the plurality of the memory units 10 may be stacked vertically over a single access device. In contrast, the access devices 100 are laterally spaced and take up more chip area than a memory unit of the plurality of the memory units 10. In alternative embodiments, this memory cell may be used to achieve a multi bit memory cell as described below using FIG. 9.

FIG. 1C illustrates a memory cell comprising a transistor and a memory unit in accordance with an embodiment of the invention.

In this embodiment, the access device 100 is a transistor. The transistor may be a metal insulator semiconductor field effect transistor in one embodiment. In one embodiment, the transistor is an n-channel field effect transistor. In another embodiment, the transistor is a p-channel field effect transistor. In other embodiments, the transistor may be other types of transistors including bipolar transistors. The memory cell 15 may be a one transistor and N memory unit (1-T N-MU) memory cell in one embodiment. As illustrated in FIG. 6B, the gate of the access device 100 is coupled to a word line WL. A first source/drain node of the access device 100 is coupled to a bit line BL while a second source/drain node of the access device 100 is coupled to the memory unit through the second node 2. Thus, the plurality of memory units 10 is coupled to the bit line BL through a channel region of the access device 100. The body of the access device 100 may be coupled to a body voltage node, which may be grounded in some embodiments.

Figure 2:
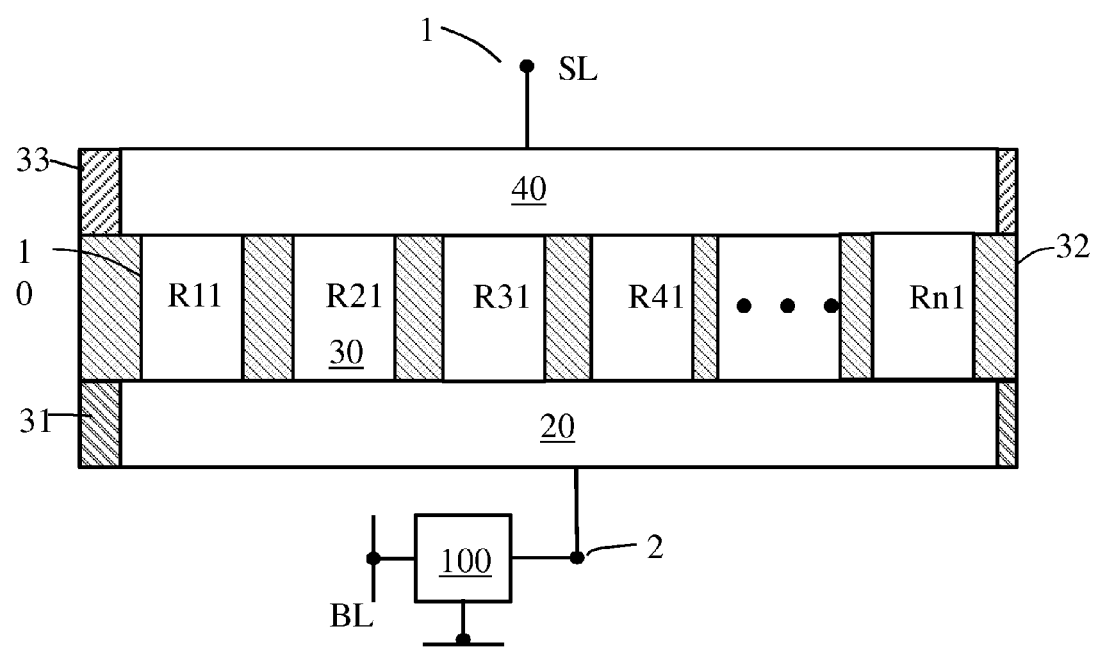
FIG. 2 illustrates a cross-sectional view of a schematic of a memory cell comprising a plurality of memory units in accordance with embodiments of the invention.

FIG. 2 illustrates a cross-sectional view of a schematic of a memory cell comprising a plurality of memory units in accordance with embodiments of the invention. FIG. 2 is a structural embodiment of the memory cell illustrated in FIG. 1A.

The memory cell comprises a first conductive layer 20, a second conductive layer 40, and a plurality of variable impedance regions 30. The first conductive layer 20 is coupled to the bit line through the access device 100, e.g., through an underlying metal line.

The first conductive layer 20 is embedded within a first insulating layer 31. The first insulating layer 31 may comprise silicon nitride and may be about 10 nm to about 100 nm, and about 30 nm to about 50 nm in one case. In one or more embodiments, the first insulating layer 31 may be deposited using a chemical vapor deposition process or a plasma enhanced chemical vapor deposition process. The first insulating layer 31 may be deposited using a plasma vapor deposition (PVD), although in different embodiments, other deposition techniques may be used.

In various embodiments, the first conductive layer 20, which is the bottom electrode of the memory cell, comprises an electrochemically inert material. Therefore, in one embodiment, tungsten (W) may be chosen for the first conductive layer 20. W-plugs, which are typically used as interconnects between two metal levels, may be used as the bottom electrode for the memory cell. Accordingly, the first conductive layer 20 may comprise a fill material, e.g., comprising tungsten, and a barrier layer surrounding the fill material. In other embodiments, the first conductive layer 20 may comprise platinum, ruthenium, titanium nitride, tantalum nitride, titanium tungsten (TiW), molybdenum, gold, nickel, cobalt, iridium, and combinations thereof, and such others. The barrier layer of the first conductive layer 20 is designed to prevent in-diffusion of metal atoms from an underlying metal line (e.g., coupled to the access device 100). Further, the barrier layer may be configured to promote adhesion with the first insulating layer 31. In one embodiment, the barrier layer comprises tantalum nitride to prevent copper diffusion from the underlying metal line. In an alternative embodiment, the barrier layer comprises titanium nitride. In other embodiments, the barrier layer may comprise ruthenium, tungsten nitride, and other suitable materials used as barrier in the semiconductor industry.

The plurality of variable impedance regions 30 is embedded within a second insulating layer 32, which isolates each region of the plurality of variable impedance regions 30 from an adjacent region of the plurality of variable impedance regions 30. Examples of the second insulating layer 32 may include silicon di oxide, TEOS oxide, silicon nitride, silicon oxynitride, and other low-k dielectrics. The second insulating layer 32 may be deposited using a vapor deposition process such as a chemical vapor deposition, a PVD, or a plasma enhanced CVD, as well as other processes including spin-on process, atomic layer deposition in various embodiments. The second insulating layer 32 may comprise more than one layer in some embodiments.

In various embodiments, the plurality of variable impedance regions 30 may comprise a chalcogenide material such as a germanium based chalcogenide. In various embodiments, the plurality of variable impedance regions 30 may comprise a thin film of $GeS_2$ deposited by radio frequency (RF) plasma vapor deposition (PVD) process and a thin layer of Ag deposited by DC PVD process. This Ag layer is subsequently dissolved into the $GeS_2$ film using a photo-diffusion process to from a silver doped $GeS_2$ layer. The plurality of variable impedance regions 30 may comprise copper doped $GeS_2$ in alternative embodiments. In other embodiments, the plurality of variable impedance regions 30 may comprise copper doped $WO_3$, $Cu/Cu_2S$, $Cu/Ta_2O_5$, $Cu/SiO_2$, $Ag/Zn_xCd_{1-x}S$, $Cu/Zn_xCd_{1-x}S$, $Zn/Zn_xCd_{1-x}S$, GeTe, GST, As—S, $Zn_xCd_{1-x}S$, $TiO_2$, $ZrO_2$, and $SiO_2$. In some embodiment, the plurality of variable impedance regions 30 may comprise a plurality of layers and may include bilayers such as $Ge_xSe_y/SiO_x$, $Ge_xSe_y/Ta_2O_5$, $Cu_xS/Cu_xO$, $Cu_xS/SiO_2$ and combinations thereof.

In alternative embodiments, the plurality of variable impedance regions 30 may comprise metal oxides having the ability to change conductivity such as titanium oxide ($TiO_x$), hafnium oxide ($HfO_x$), nickel oxide ($NiO_x$), copper doped oxide, copper oxides ($CuO_x$), zirconium oxides ($ZrO_x$), strontium zirconium oxides ($SrZrO_x$), aluminum oxide ($Al_2O_3$), tantalum oxides/titanium oxide ($Ta_2O_5/TiO_2$) stacks, carbon based materials, cobalt oxide ($CoO_x$), tungsten oxide ($WO_x$), zinc oxide ($ZnO_x$), and others. Further, in some embodiments, the plurality of variable impedance regions 30 may comprise doped metal oxides such as copper and/or silver doped hafnium oxide, gadolinium oxide, and other such materials. In other examples, the plurality of variable impedance regions 30, for example, may comprise chromium doped perovskite oxides such as $SrZrO_3$, (Ba, Sr)$TiO_3$, $SrTiO_3$, coped doped $MoO_x$, coped doped $Al_2O_3$, copper doped $ZrO_2$, Al doped ZnO, $Pr_{0.7}Ca_{0.3}MnO_3$.

The second conductive layer 40 is embedded within a third insulating layer 33. In some embodiments, the second insulating layer 32 and the third insulating layer 33 may be a single layer. In various embodiments, the third insulating layer 33 may comprise silicon di oxide, TEOS oxide, silicon nitride, silicon oxynitride, and other low-k dielectrics.

In various embodiments, the second conductive layer 40 may comprise an electrochemically active metal such as silver, copper, zinc, tellurium, and combinations thereof. If the memory unit comprises a metal oxide based resistive switching memory, the second conductive layer 40 may comprise molybdenum, platinum, gold, titanium, tantalum, ruthenium, titanium nitride, aluminum, copper, and others. Further, in various embodiments, the memory cell may comprise an inverted cell in which the second conductive layer 40 is inert while the first conductive layer 20 is electrochemically active.

Thus, a plurality of memory units 10 having the plurality of variable impedance regions 30 is formed between the first conductive layer 20 and the second conductive layer 40. The plurality of variable impedance regions 30 may be a solid electrolyte layer that is programmable, for example, by the application of external stimuli such as electric potential, heat, magnetic field, and others. In other words, the impedance across the plurality of variable impedance regions 30 may be changed by the application of a program operation and a corresponding erase operation. For example, after a program operation, the plurality of variable impedance regions 30 has a low impedance (ON state) whereas, after an erase operation, the plurality of variable impedance regions 30 has a high impedance (OFF state). The operation (programming/erase) of the memory cell may involve nano-scale migration and rearrangement of conductive atoms such as metal atoms through the plurality of variable impedance regions 30. Alternatively, the memory cell may operate due to the motion of defects such as point defects within the plurality of variable impedance regions 30. The program/erase operations may be performed by applying an electrical signal between a first node 1 and a second node 2.

Figure 3:
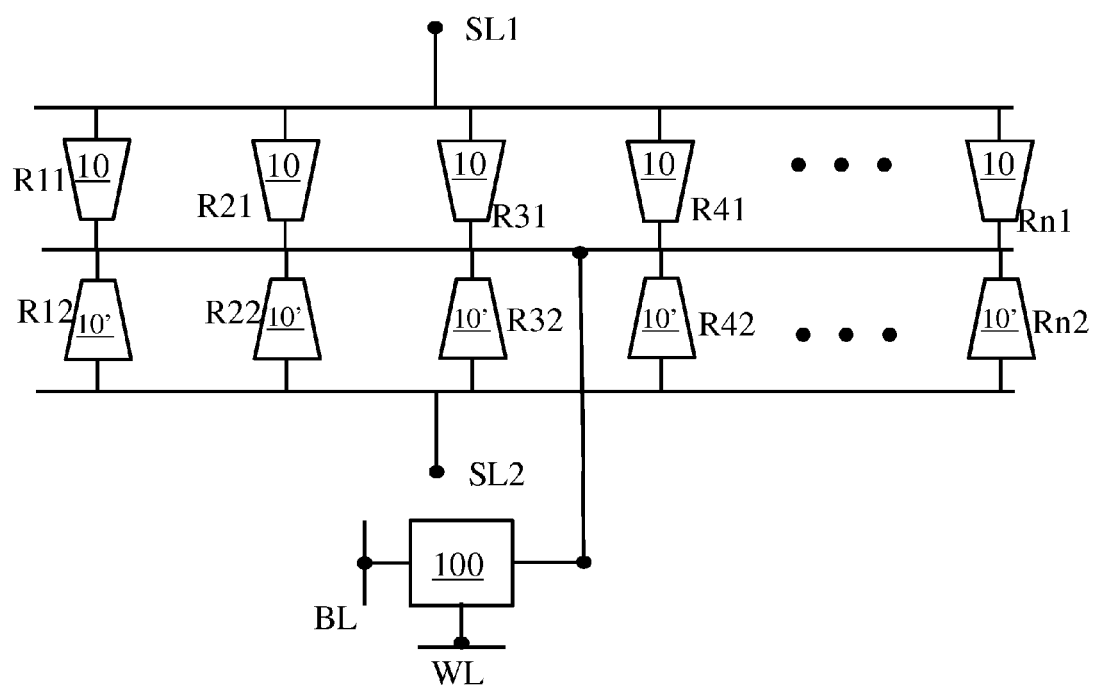
FIG. 3 illustrates a schematic illustration of a memory cell in accordance with an alternative embodiment of the invention.

FIG. 3 illustrates a schematic illustration of a memory cell in accordance with an alternative embodiment of the invention.

FIG. 3 illustrates a first array of memory units 10 coupled between the access device 100 and a first select line SL1 and a second plurality of memory units 10' in a second array coupled between the access device 100 and a second select line SL2.

As illustrated in FIG. 3, the first array of the plurality of memory units 10 comprises a first memory unit R11, a second memory unit R21, a third memory unit R31, a fourth memory unit R41, and ending with a nth memory unit Rn1. The second plurality of memory units 10' in a second array comprises a first memory unit R12, a second memory unit R22, a third memory unit R32, a fourth memory unit R42, and ending with a nth memory unit Rn2.

When the first select line SL1 is coupled to the second select line SL2, the circuit is similar to the embodiment described in FIG. 1A. However, as illustrated in FIG. 4, the structural implementation of FIG. 3 may be different from the structural implementation of FIG. 1A, which was described using FIG. 2.

Figure 4:
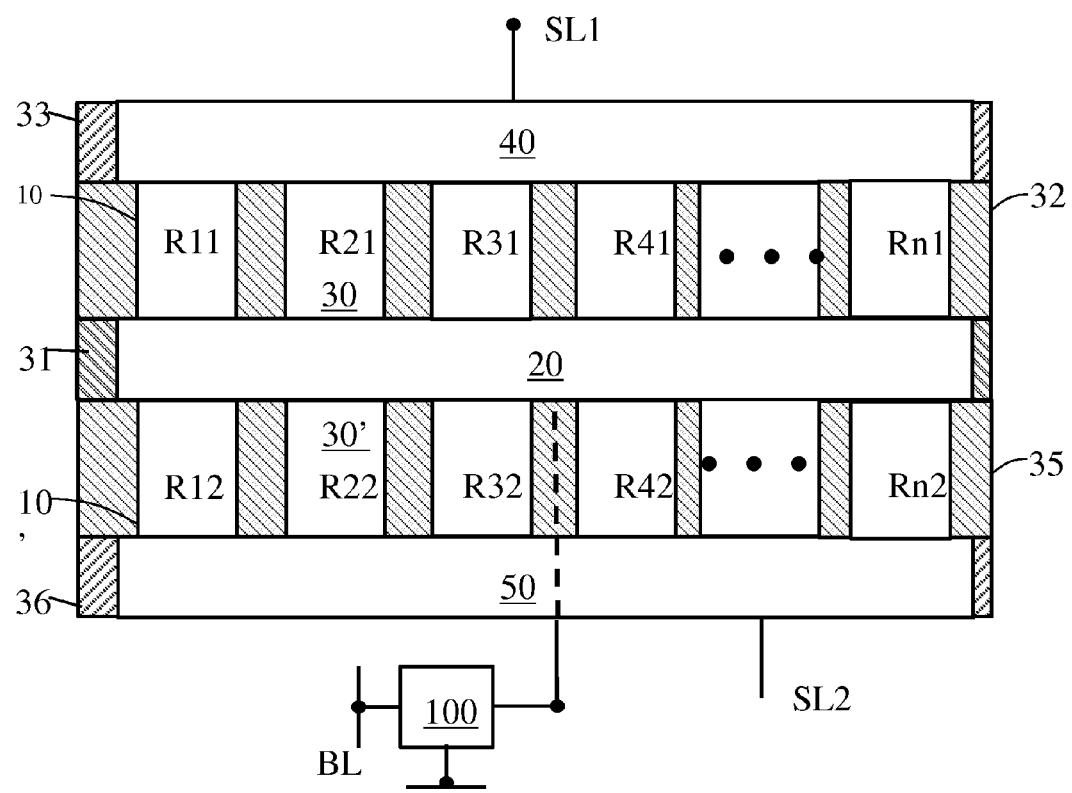
FIG. 4 illustrates a cross-sectional view of a schematic of a memory cell comprising at least two levels of plurality of memory units in accordance with embodiments of the invention.

FIG. 4 illustrates a cross-sectional view of a schematic of a memory cell comprising at least two levels of plurality of memory units in accordance with embodiments of the invention. FIG. 4 is a structural embodiment of the memory cell illustrated in FIG. 3.

As illustrated in FIG. 4, a first array of the plurality of memory units 10 comprises a first memory unit R11, a second memory unit R21, a third memory unit R31, a fourth memory unit R41, and ending with a nth memory unit Rn1 is disposed within the second insulating layer 32 as described previously. Further, a second plurality of memory units 10' in a second array comprises a first memory unit R12, a second memory unit R22, a third memory unit R32, a fourth memory unit R42, and ending with a nth memory unit Rn2 is disposed within a fourth insulating layer 35. The memory units of the second array may be similar in terms of electrical performance (e.g., ON/OFF resistance) to the memory units of the first array in some embodiments. For example, the second array may be similar to the first array so as to increase redundancy without increasing foot print (chip area). However, in other embodiments, the memory units of the second array may be different from the memory units of the first array, for example, to facilitate multi-bit programming.

A second plurality of variable impedance regions 30' is disposed within the fourth insulating layer 35. In various embodiments, the fourth insulating layer 35 may comprise silicon di oxide, TEOS oxide, silicon nitride, silicon oxynitride, and other low-k dielectrics.

The second plurality of variable impedance regions 30' may be similar to the plurality of variable impedance regions 30 in some embodiments. In one embodiment, the plurality of variable impedance regions 30 and the second plurality of variable impedance regions 30' comprise the same material, thickness, and feature sizes.

A third conductive layer 50 is disposed under the second plurality of variable impedance regions 30'. The third conductive layer 50 may be embedded within a fifth insulating layer 36. In various embodiments, the fifth insulating layer 36 may comprise silicon di oxide, TEOS oxide, silicon nitride, silicon oxynitride, and other low-k dielectrics.

In one embodiment, the third conductive layer 50 is the same as the second conductive layer 40. In alternative embodiments, the third conductive layer 50 may be different from the second conductive layer 40 and/or the second plurality of variable impedance regions 30' may be different from the plurality of variable impedance regions 30 as will be also described further using FIGS. 9-14.

In some embodiments, the second plurality of variable impedance regions 30' may be a different type of memory from the plurality of variable impedance regions 30. For example, the plurality of variable impedance regions 30 may form part of a programmable metallization cell (PMC) while the second plurality of variable impedance regions 30' may comprise a metal oxide based RRAM.

Figure 5:
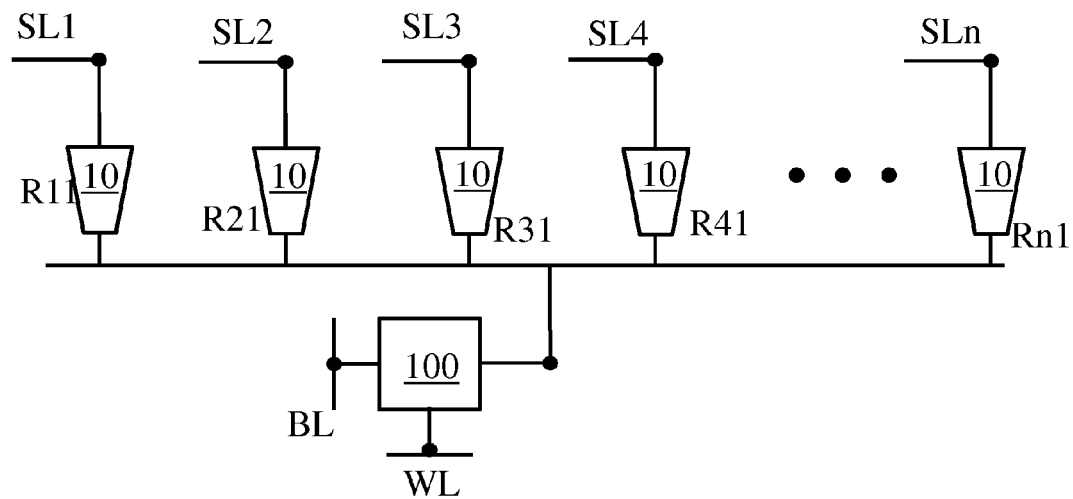
FIG. 5 illustrates a schematic circuit of a memory cell in which each memory unit of an array of memory units is coupled separately in accordance with an alternative embodiment of the invention.

FIG. 5 illustrates a schematic circuit of a memory cell in which each memory unit of an array of memory units is coupled separately in accordance with an alternative embodiment of the invention.

Referring to FIG. 5, a first terminal of each of the memory unit 10 is commonly coupled to an access device 100. However, a second terminal of each memory unit of the plurality of memory units 10 is coupled to different select lines. For example, the memory cell comprises a first memory unit R11 coupled to a first select line SL1, a second memory unit R21 coupled to a second select line SL2, a third memory unit R31 coupled to a third select line SL3, a fourth memory unit R41 coupled to a fourth select line SL4, and ending with a nth memory unit Rn1 coupled to a Nth select line SLn.

Therefore, each of the memory unit of the plurality of memory units 10 may be programmed separately. For example, this may be used to ensure that every memory unit is fully programmed. As an illustration, in the circuit illustrated in FIG. 1A, if the first memory unit R11 is programmed before the other memory units due to a lower threshold voltage, more current flows through the programmed first memory unit R11 relative to the other cells. As a result the other cells may remain unprogrammed while the first memory unit R11 gets programmed further (e.g., due to thickening of the conductive filament). Using an independent programming operation may avoid such issues. However, advantageously, the erase may still be performed in parallel by grounding all the select lines and applying an erase voltage on the bit line BL. Unlike programming, the erasing process ends when all the conductive atoms deposited during programming within the plurality of variable impedance regions 30 are restored back into the second conductive layer 40 (FIG. 2). Therefore, the erase process starts at the cell with the lowest erase threshold but stops after the cell is erased. Thus, the erasure may occur sequentially until all the plurality of variable impedance regions 30 is erased.

Figure 6A:
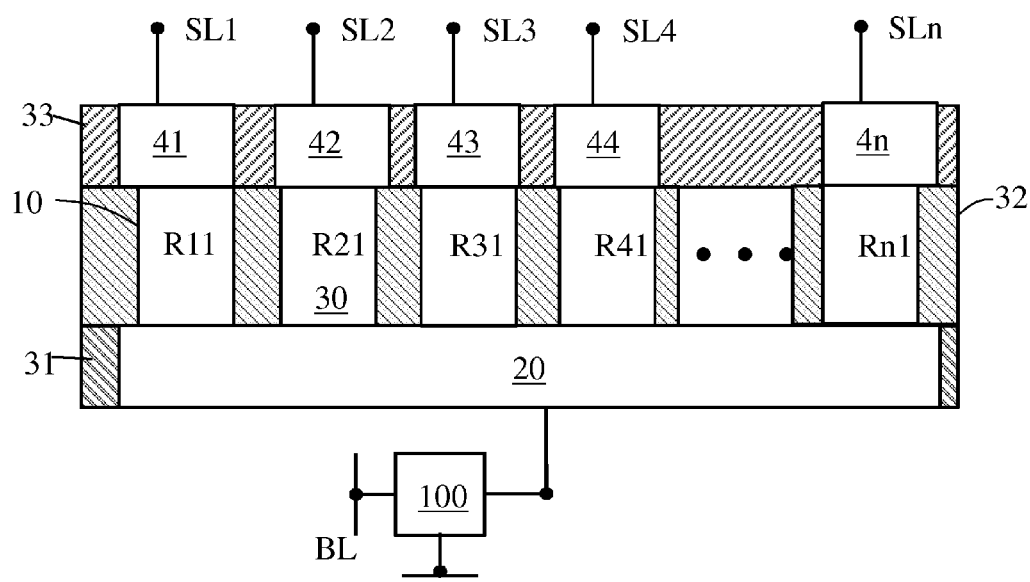
Figure 6B:
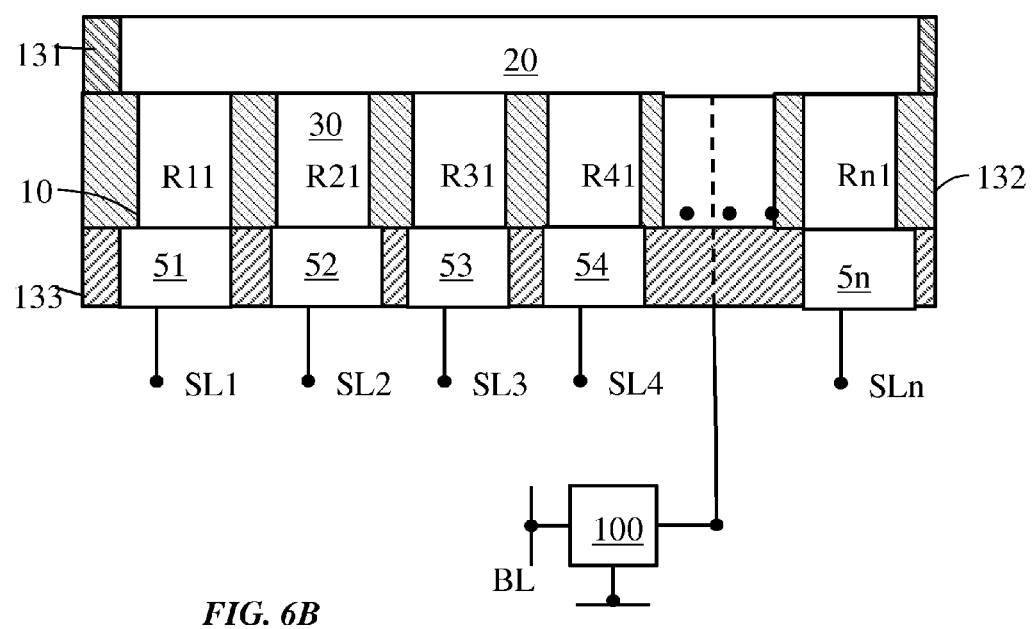

FIG. 6, which includes FIGS. 6A and 6B, illustrate different embodiments of implementing the circuit illustrated in FIG. 5, wherein FIG. 6A illustrates a normal cell while FIG. 6B illustrates an inverted cell.

Referring to FIG. 6A, each of the memory unit of the plurality of memory units 10 may have a separate anode. For example, the first memory unit R11 comprises a first electrochemically active top electrode 41, a second memory unit R21 comprises a second electrochemically active top electrode 42, a third memory unit R31 comprises a third electrochemically active top electrode 43, a fourth memory unit R41 comprises a fourth electrochemically active top electrode 44, and ending with a nth memory unit Rn1 comprises a Nth electrochemically active top electrode 4n. In the normal cell configuration illustrated in FIG. 6A, the electrochemically active electrode is above the inert electrode formed by the common first conductive layer 20.

In the alternative inverted cell embodiment illustrated in FIG. 6B, the electrochemically active electrode is below the inert electrode formed by the common first conductive layer 20. Thus, the first memory unit R11 comprises a first electrochemically active bottom electrode 51, a second memory unit R21 comprises a second electrochemically active bottom electrode 52, a third memory unit R31 comprises a third electrochemically active bottom electrode 53, a fourth memory unit R41 comprises a fourth electrochemically active bottom electrode 54, and ending with a nth memory unit Rn1 comprises a Nth electrochemically active bottom electrode 5n. As described previously, the common first conductive layer 20 is disposed within a first dielectric layer 131, a plurality of variable impedance regions 30 is disposed within a second dielectric layer 132, and the electrochemically active bottom electrodes 5l-5n are disposed within a third dielectric layer 133. The first, the second, and the third dielectric layers 131, 132, and 133 may be formed as described previously with respect to the first, the second, and the third insulating layers 31, 32, and 33.

Figure 7:
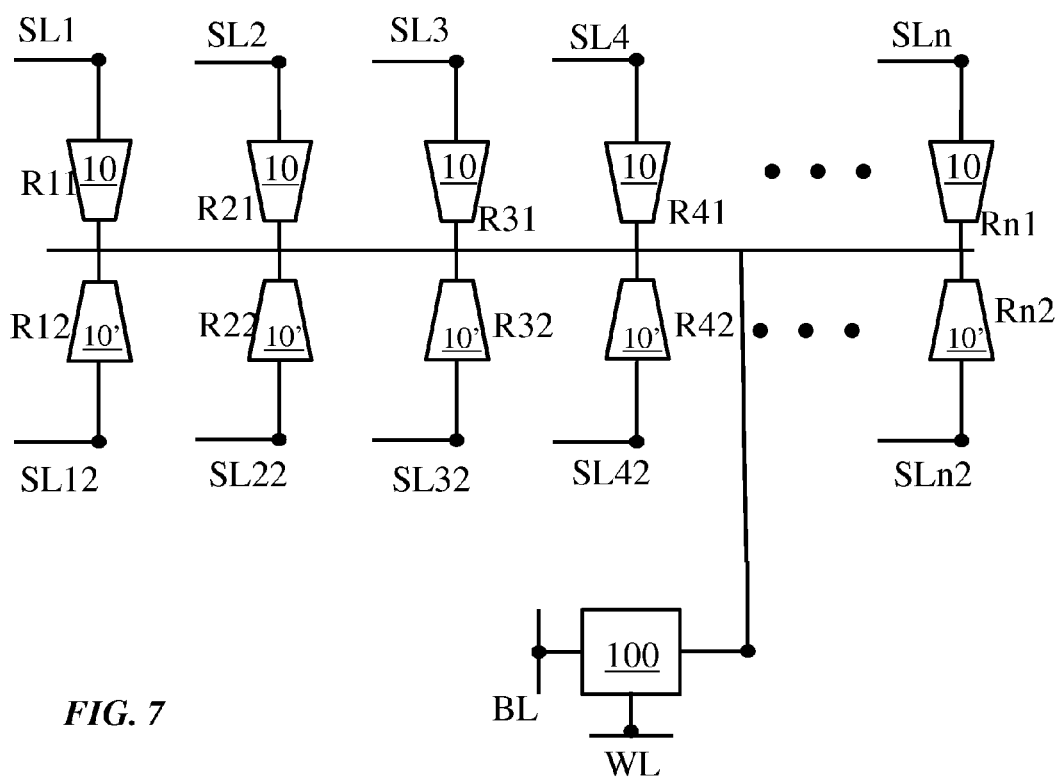
FIG. 7 illustrates a schematic circuit of a memory cell in which each memory unit of an array of memory units is coupled separately while incorporating redundancy in accordance with another embodiment of the invention.

FIG. 7 illustrates a schematic circuit of a memory cell in which each memory unit of an array of memory units is coupled separately while incorporating redundancy in accordance with another embodiment of the invention.

Referring to FIG. 7, a first array of the plurality of memory units 10 comprises a first memory unit R11, a second memory unit R21, a third memory unit R31, a fourth memory unit R41, and ending with a nth memory unit Rn1. A second plurality of memory units 10' in a second array comprises a first memory unit R12, a second memory unit R22, a third memory unit R32, a fourth memory unit R42, and ending with a nth memory unit Rn2.

A first terminal of each memory of the plurality of memory unit 10 and the second plurality of memory units 10' is commonly coupled to an access device 100. Unlike the prior embodiment of FIG. 3, each of the memory unit is coupled to a separate select line. Thus, the first memory unit R11 of the first array may be coupled to a first select line SL1, the second memory unit R21 of the first array may be coupled to a second select line SL2, the third memory unit R31 of the first array may be coupled to a third select line SL3, the fourth memory unit R41 of the first array may be coupled to a fourth select line SL4, and the nth memory unit Rn1 of the first array may be coupled to a Nth select line SLn. Similarly, the first memory unit R12 of the second array may be coupled to a first select line SL12, the second memory unit R22 of the second array may be coupled to a second select line SL22, the third memory unit R32 of the second array may be coupled to a third select line SL32, the fourth memory unit R42 of the second array may be coupled to a fourth select line SL42, and the nth memory unit Rn2 of the second array may be coupled to a Nth select line SLn2. However, in some embodiments, the first select line SL1 of the first array may be coupled to the first select line SL12 of the second array. Thus, the memory cell may include some memory units that may be programmed in parallel and some memory units that may be programmed in serial.

Figure 8:
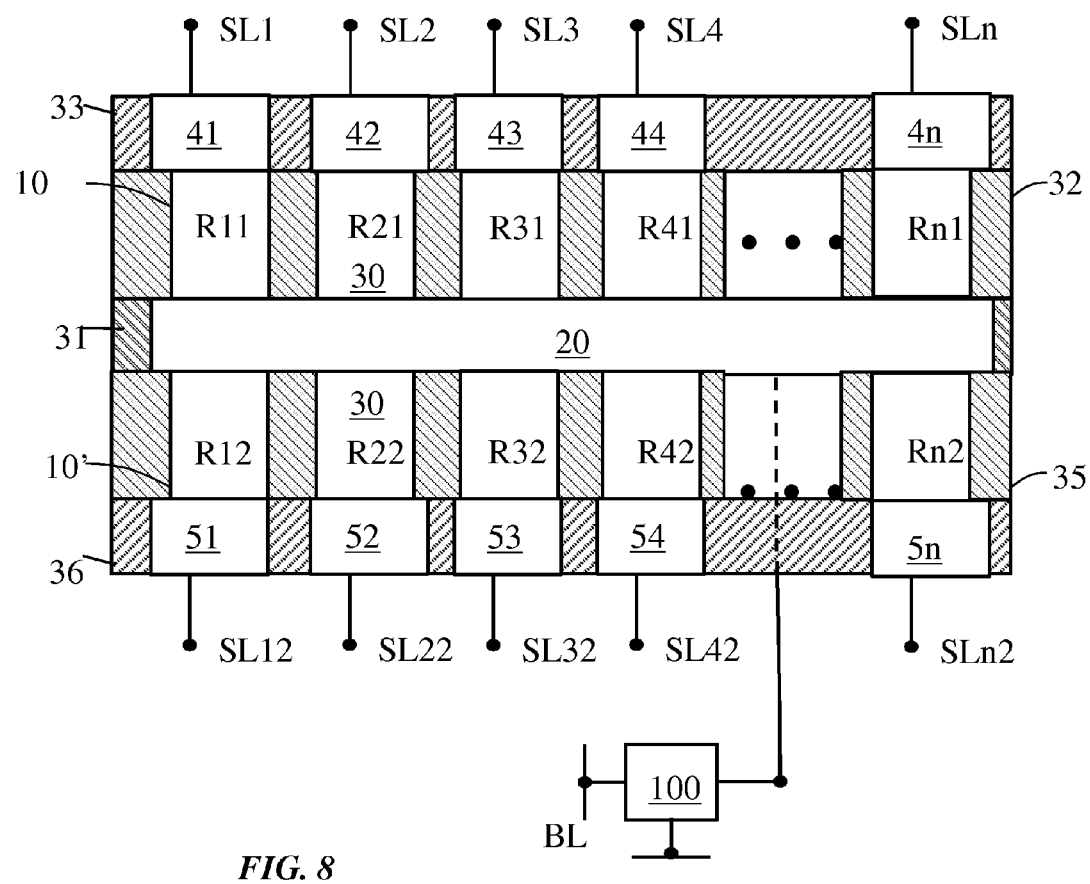
FIG. 8 illustrates a cross-sectional view of a schematic of a memory cell comprising at least two levels of plurality of memory units in accordance with embodiments of the invention.

FIG. 8 illustrates a cross-sectional view of a schematic of a memory cell comprising at least two levels of plurality of memory units in accordance with embodiments of the invention. FIG. 8 is a structural embodiment of the memory cell illustrated in FIG. 7.

The memory cell comprises the plurality of memory units 10 in a first array having a normal configuration and a second plurality of memory units 10' in a second array having an inverted cell configuration. In the normal cell configuration, the electrochemically active electrode is above the inert electrode formed by the common first conductive layer 20 while in the inverted cell configuration the electrochemically active electrode is below the inert electrode formed by the common first conductive layer 20.

Referring to FIG. 8, the cathode of the plurality of memory units 10 and the cathode of the second plurality of memory units 10' is commonly coupled to the access device. Accordingly, a common first conductive layer 20 may be a cathode for both the arrays.

However, each memory unit of the plurality of memory units 10 and the second plurality of memory units 10' may have a separate anode. Thus, the first memory unit R11 of the first array comprises a first electrochemically active top electrode 41, a second memory unit R21 of the first array comprises a second electrochemically active top electrode 42, a third memory unit R31 of the first array comprises a third electrochemically active top electrode 43, a fourth memory unit R41 of the first array comprises a fourth electrochemically active top electrode 44, and ending with a nth memory unit Rn1 of the first array comprises a Nth electrochemically active top electrode 4n. Similarly, the first memory unit R12 of the second array comprises a first electrochemically active bottom electrode 51, a second memory unit R22 of the second array comprises a second electrochemically active bottom electrode 52, a third memory unit R32 of the second array comprises a third electrochemically active bottom electrode 53, a fourth memory unit R42 of the second array comprises a fourth electrochemically active bottom electrode 54, and ending with a nth memory unit Rn2 of the second array comprises a Nth electrochemically active bottom electrode 5n.

As described earlier, the normal cell and the inverted cell may be targeted to have similar electrical behavior so that a two level redundancy is achieved while programming in parallel. Alternatively, the normal and inverted cells may have different electrical parameters such as threshold voltage and ON state impedance so that a multi-bit cell may be formed.

FIGS. 9-14 illustrate additional embodiments of the invention applied to multi-bit cell architecture.

Figure 9A:
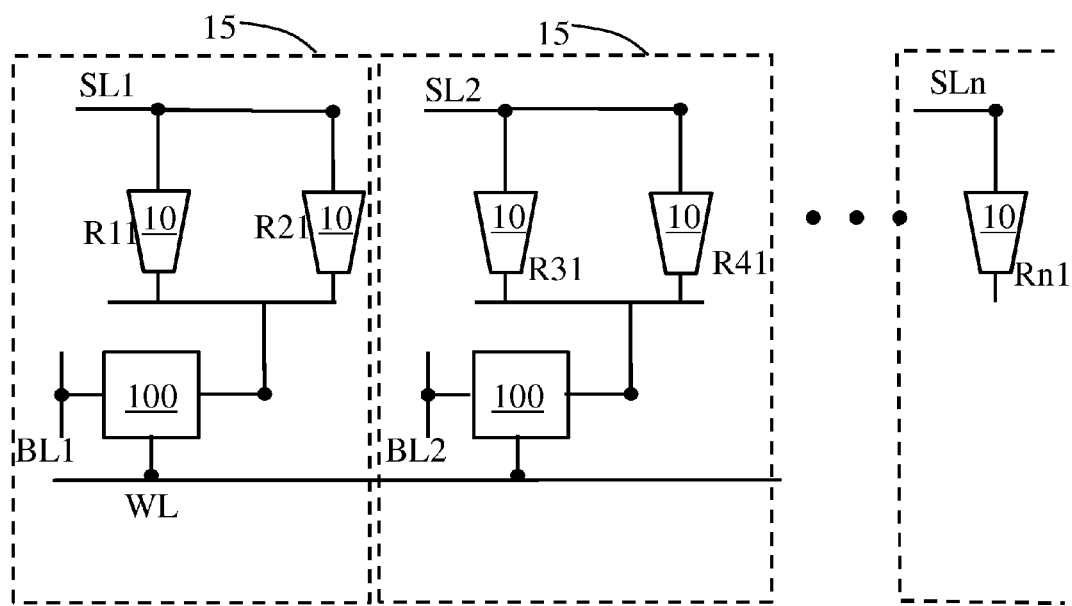
Figure 9B:
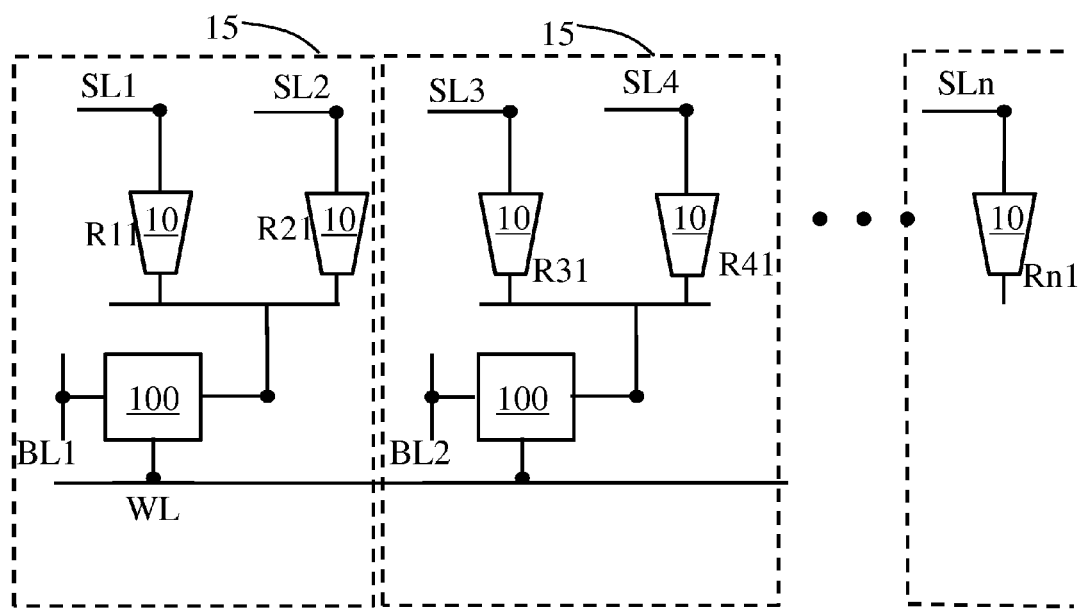
Figure 9C:
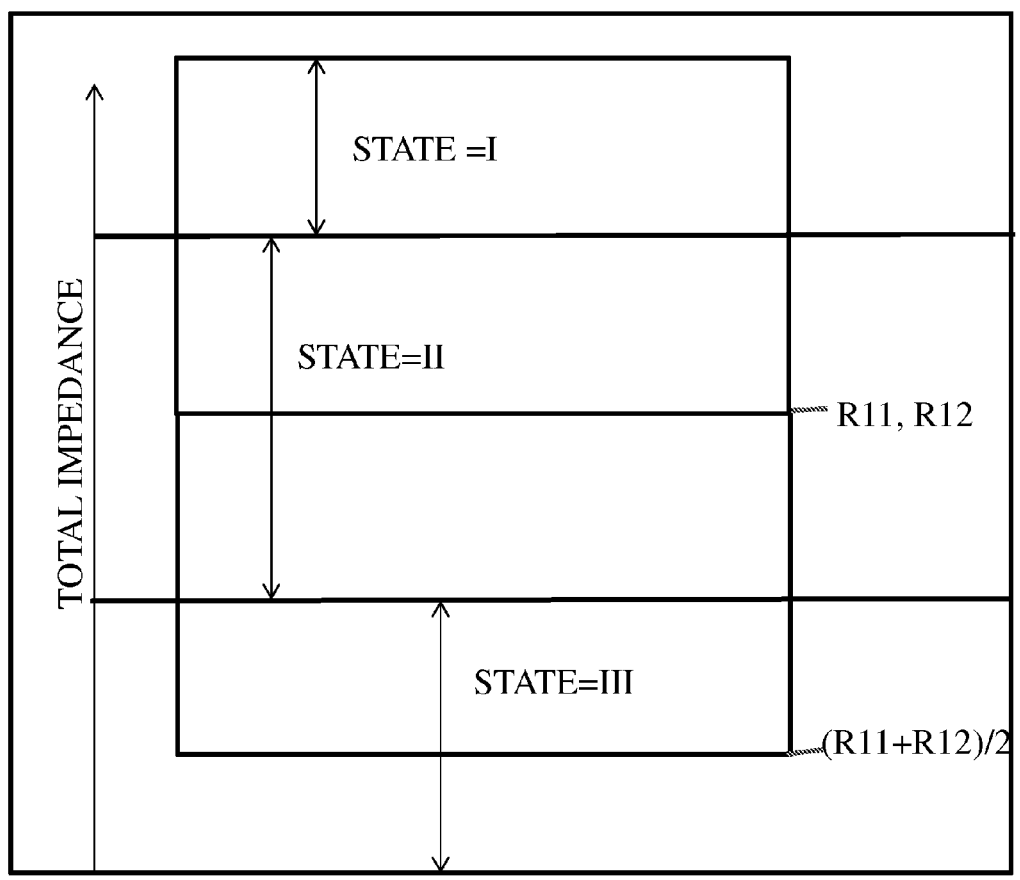
Figure 9D:
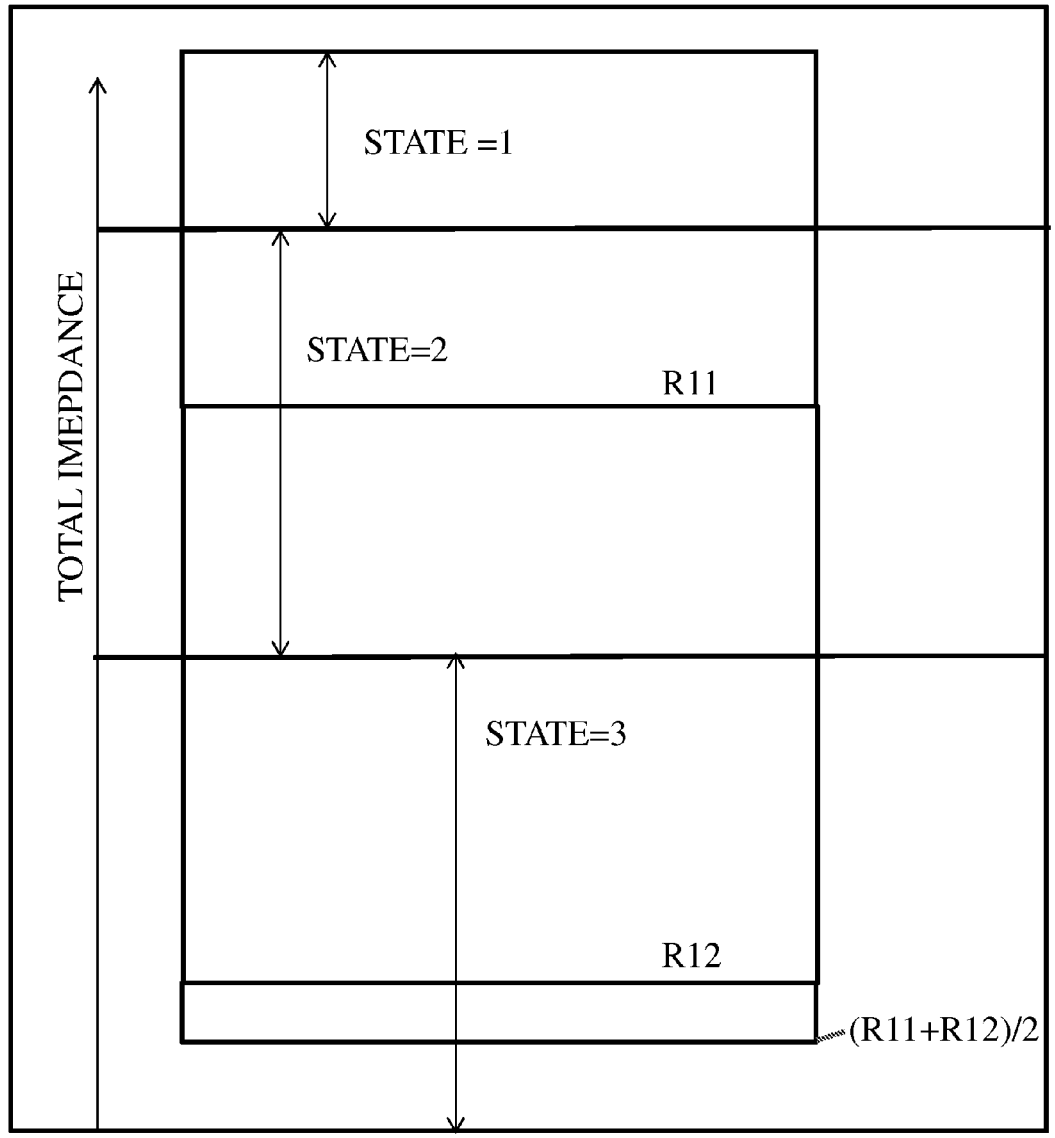

FIG. 9, which includes FIGS. 9A-9E, illustrates a multi-bit memory cell in accordance with embodiments of the invention, wherein FIGS. 9A and 9B illustrate circuit schematics of the memory cell, wherein FIGS. 9C and 9D illustrate impedance states of the memory cell, and wherein FIG. 9E illustrates a representative operation of the multi-bit memory cell.

Referring to FIG. 9A, the memory cell 15 comprises at least two memory units each, for example, a first memory unit R11 of a plurality of memory units 10 and a second memory unit R12 of a plurality of memory units 10 form part of a memory cell 15. A third memory unit R31 of a plurality of memory units 10 and a fourth memory unit R41 of a plurality of memory units 10 form part of another memory cell 15. Each of the memory cell 15 comprises an access device 100. The illustrated memory cell is therefore a one-access device two-memory unit (1-AD 2-MU) cell. The 1-AD 2-MU as described in FIGS. 9A and 9B may be used to form a 3-bit memory cell. However, in various embodiments, more than two (e.g., n) memory units may be used so as to form a multi-bit (e.g., n−1) memory cell.

While FIG. 9A illustrates a common anode and cathode layers, embodiments of the invention also include use of separate anode so as to program the memory units serially as previously described, for example, in FIG. 5. This embodiment is illustrated in FIG. 9B. Serial programming may be advantageous when the memory units have different threshold voltages.

FIGS. 9C-9E illustrate the operational impedance states of the memory device in accordance with embodiments of the invention. FIG. 9C illustrates an embodiment, wherein the ON state impedances of both the memory units are similar. Referring to FIG. 9C, the total impedance of the first and the second memory units R11 and R21 is about half the impedance of either the first memory unit R11 or the second memory unit R21. When none of the memory units are programmed, the total impedance of the memory cell falls under a high impedance state (STATE=I). When only one of the memory unit is programmed using, for example, separate select lines as illustrated in FIG. 9B, the memory cell has an intermediate impedance state (STATE=II). When both the memory units are programmed, the memory cell is in a low impedance state (STATE=III).

However, the range of impedance for the intermediate impedance state may be too narrow for stable multi-bit operation. The embodiment of FIG. 9D illustrates using memory units having different ON state impedance to overcome the limitation. The first memory unit R11 may be a different type or a same type of memory as the second memory unit R12. As illustrated in FIG. 9D, the ON state impedance of the first memory unit R11 is much higher than the ON state impedance of the second memory unit R21. Therefore, the third state may encompass either just the second memory unit R21 or the combination of the first and the second memory units R11 and R21. In various embodiments, the first memory unit R11 may have different threshold voltage from the threshold voltage of the second memory unit R21 so that they can be programmed in parallel.

FIG. 9E illustrates a representative operation of the multi-bit memory cell in accordance with an embodiment of the invention.

The read voltage (e.g., $V_1$) is lower than the threshold voltage of either the memory units. The memory cell after a full erasure during such a read operation is in a high impedance state (STATE=I).

If a first program voltage $V_2$ is applied to the first memory unit R11 either serially or parallel (as described in FIGS. 9A and 9B), the first memory unit R11 switches to an ON state. If the first program voltage $V_2$ is lower than the threshold voltage of the second memory unit R21, then only the first memory unit R11 is programmed even if the first program voltage $V_2$ is applied on the second memory unit R21 (parallel configuration). Thus, during a subsequent read operation, the memory cell has a second state (STATE=II).

If a second program voltage $V_3$ higher than the threshold voltage of the second memory unit R21 is applied on the second memory unit R21, then both the first and the second memory units R11 and R21 are programmed. In a subsequent read operation, the memory cell has a third state (STATE=III).

FIG. 10, which includes FIGS. 10A-10F, illustrates cross-sectional views of a multi-bit memory cell comprising at least two memory units in accordance with embodiments of the invention. FIG. 10 is a structural embodiment of the memory cell illustrated in FIG. 9.

Figure 10A:
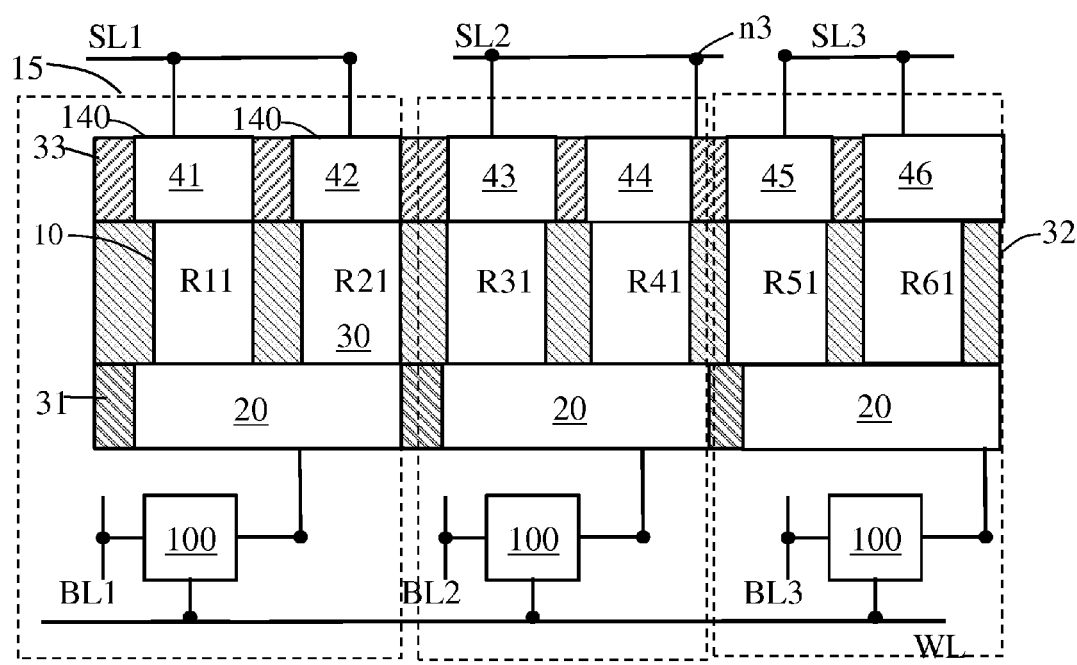
FIGS. 10A-10F, illustrates a cross-sectional view of a multi-bit memory cell comprising at least two memory units in accordance with embodiments of the invention.

Referring to FIG. 10A, each memory cell has a single common first conductive layer 20, which forms the bottom electrode of the memory cell 15. However, each memory unit of the plurality of memory units 10 may have a separate anode. For example, the first memory unit R11 comprises a first electrochemically active top electrode 41, a second memory unit R21 comprises a second electrochemically active top electrode 42, a third memory unit R31 comprises a third electrochemically active top electrode 43, a fourth memory unit R41 comprises a fourth electrochemically active top electrode 44, a fifth memory unit R51 comprises a fifth electrochemically active top electrode 45, and a sixth memory unit R61 comprises a sixth electrochemically active top electrode 46.

In various embodiments, the first memory unit R11 may be made to be different from the second memory unit R21, for example, by changing the material of the plurality of the variable impedance regions 30. Alternatively, as described in FIG. 9C, the operating conditions may be defined to ensure multi-bit operation.

FIGS. 10B-10F illustrate various embodiments of forming a multi-bit memory cell having memory units having different electrical characteristics.

Figure 10B:
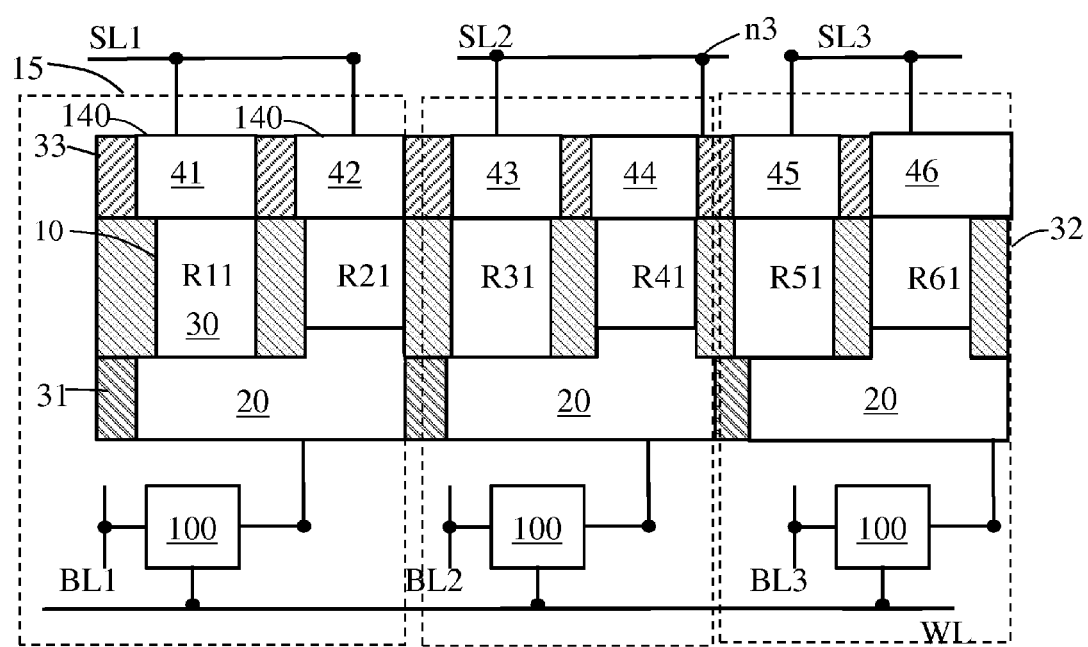

In the embodiment illustrated in FIG. 10B, the thickness of the plurality of the variable impedance regions 30 is modulated. For example, the second memory unit R21 has a lower thickness of the variable impedance regions 30 and therefore a different (lower) threshold voltage than the first memory R11. Therefore, the ON state impedance of the second memory unit R21 may be less than the ON state impedance of the first memory unit R11.

Figure 10C:
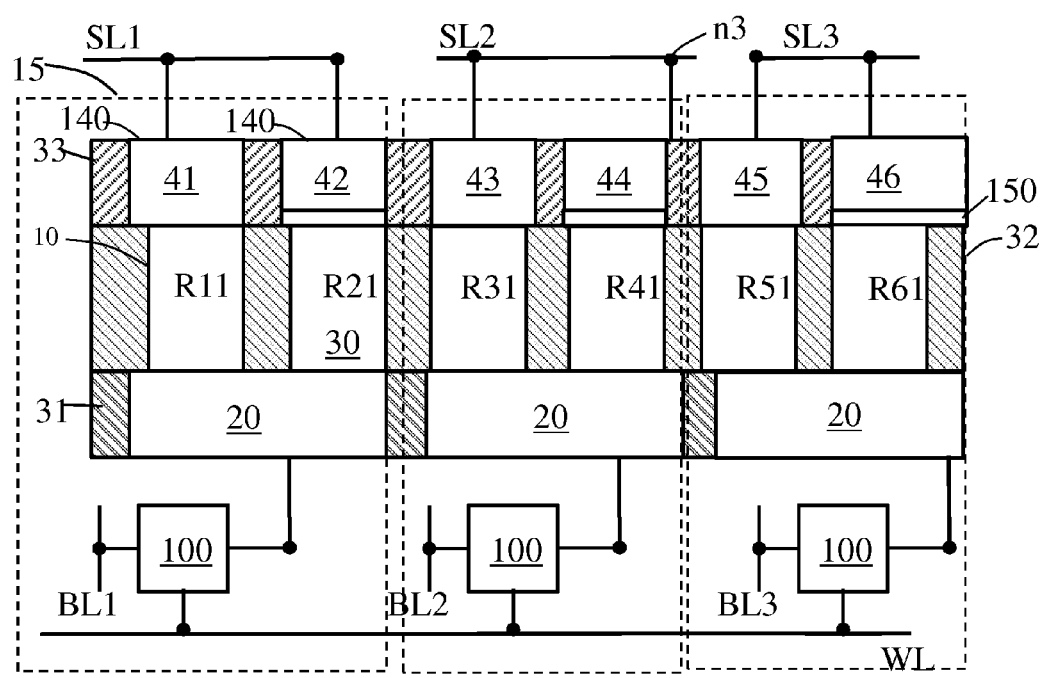

FIG. 10C illustrates an alternative embodiment in which the second electrochemically active top electrode 42 comprises an interfacial layer 150 disposed between the active material 140 and the plurality of variable impedance regions 30. The introduction of the interfacial layer 150 changes the threshold voltage and possibly the impedance of the second memory unit R21. The interfacial layer 150 may be a barrier for the diffusion of ions from the active material 140 in one embodiment. In one embodiment, the interfacial layer 150 may be a thin layer (e.g., less than 10 nm, about 1 nm to about 5 nm in one case) of another material, possibly even an inert material, which reduces the diffusivity of active ions. Examples of the interfacial layer 150 may include tantalum, titanium, tungsten, titanium nitride, tantalum nitride, tungsten nitride, platinum, and others.

Figure 10D:
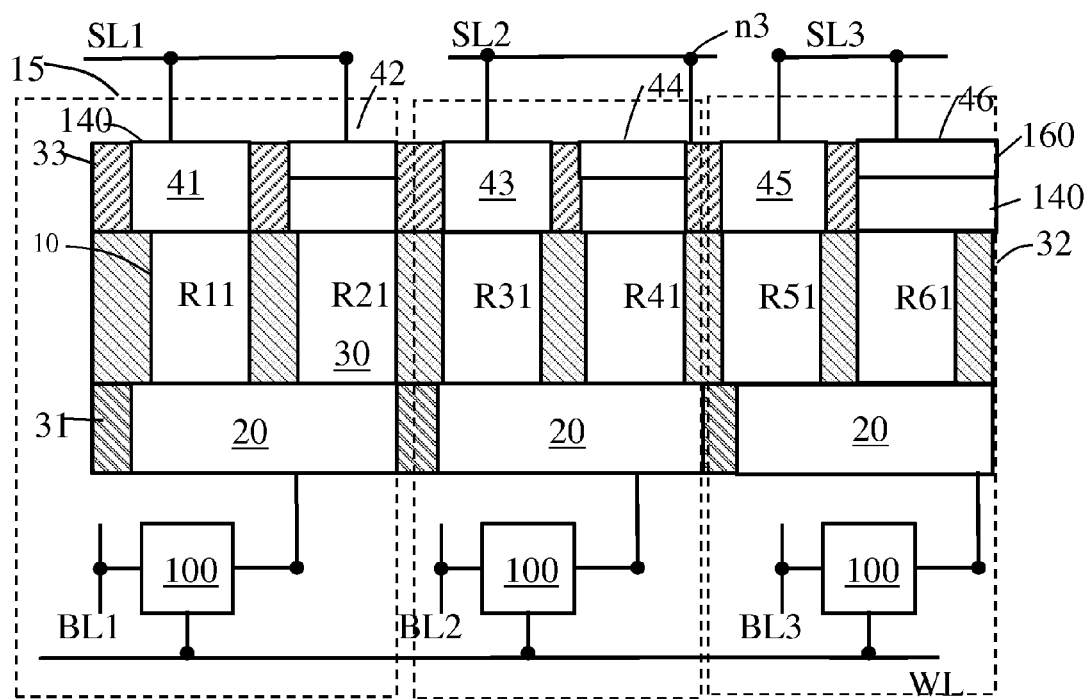

FIG. 10D illustrates an alternative embodiment in which the second electrochemically active top electrode 42 comprises a layer of active material 140 and a layer of inert material 160. The inert material 160 may be disposed over the active material 140 of the second electrochemically active top electrode 42. The layer of active material 140 of the second electrochemically active top electrode 42 is thinner than the layer of active material 140 of the first electrochemically active top electrode 41. Thus, the programming of the second memory unit R21 may be limited by the availability of active material. In such an embodiment, the ON state impedance of the second memory unit R21 may be less than the ON state impedance of the first memory unit R11.

Figure 10E:
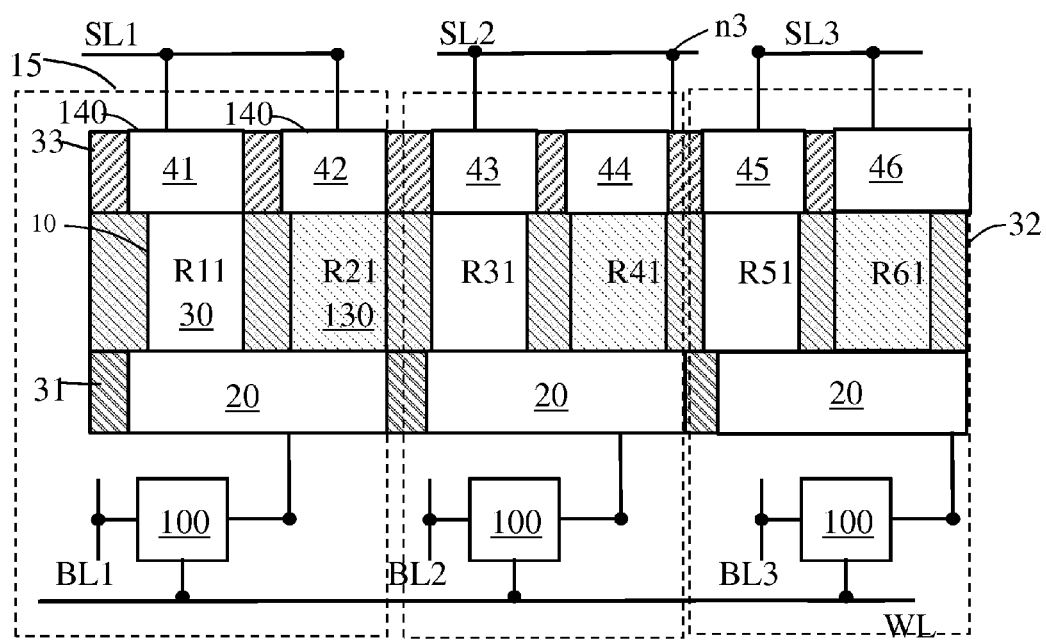

FIG. 10E illustrates an alternative embodiment in which the second memory unit R21 comprises a second plurality of the variable impedance regions 130 different from the material (e.g., different solid electrolyte material) of the plurality of the variable impedance regions 30. The difference may be due to stoichiometry, material elements, doping, and others. Further, the active material of the second electrochemically active top electrode 42 may also be different from the active material of the first electrochemically active top electrode 41 in some embodiments.

Figure 10F:
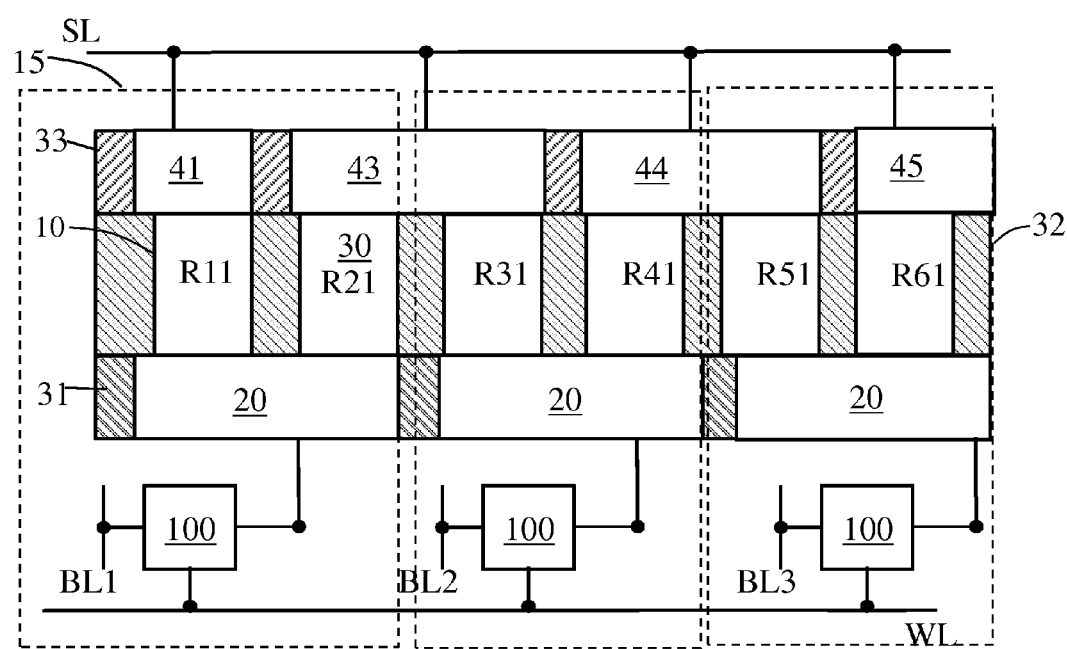

FIG. 10F illustrates an alternative embodiment in which adjacent memory cells share a common top electrode. This embodiment reduces the process complexity associated with forming different types of electrode materials. Adjacent memory cells may share a common top electrode so that small featured top electrodes may be avoided.

Figure 11:
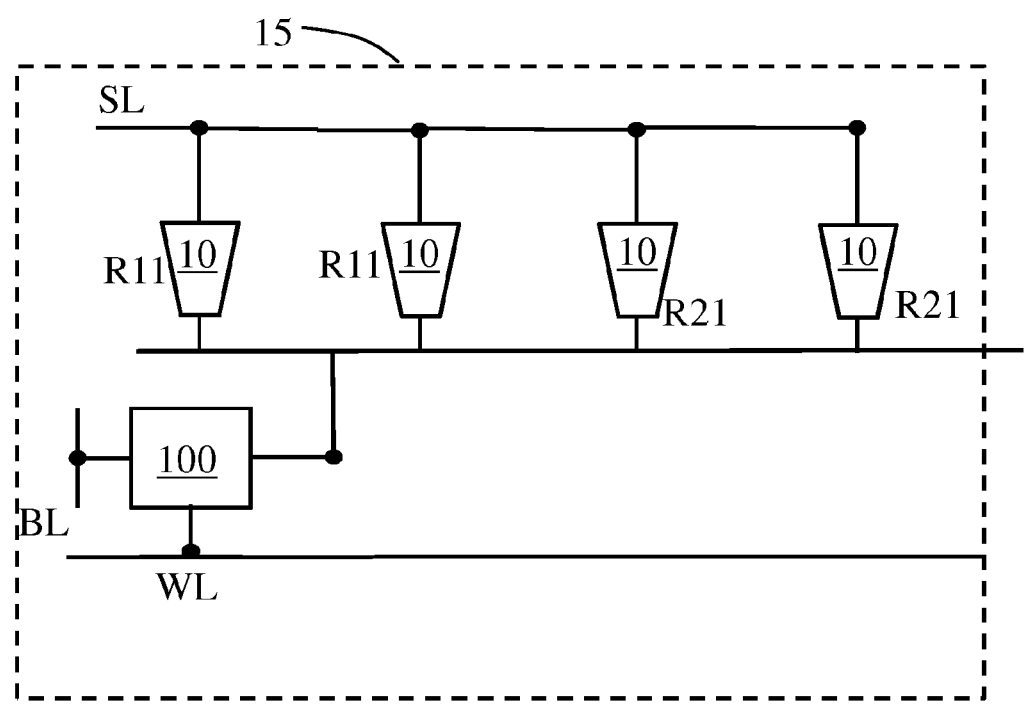
FIG. 11 illustrates a schematic of a multi-bit memory cell having redundancy in accordance with embodiments of the invention.

FIG. 11 illustrates a schematic of a multi-bit memory cell having redundancy in accordance with embodiments of the invention. FIG. 11 is a illustrative combination of embodiments described in FIGS. 1 and 9.

Referring to FIG. 11, the memory cell 15 comprises a plurality of memory units 10 having at least two first memory units R11 and at least two second memory units R21. Thus, the memory cell 15 comprises at least four memory units forming a 1-AD 4-MU memory cell. Of these, the first memory unit R11 may have a different threshold voltage and ON state impedance than the second memory unit R21 as described in FIGS. 9-10. Thus, the memory cell 15 forms a 3-bit memory cell. In various embodiments, more memory units may be added to form an n-bit memory cell 15. As described in FIG. 1, the memory cell 15 has redundancy (N=2) for each memory state. Similarly, more identical memory units may be added to increase the redundancy.

Figure 12:
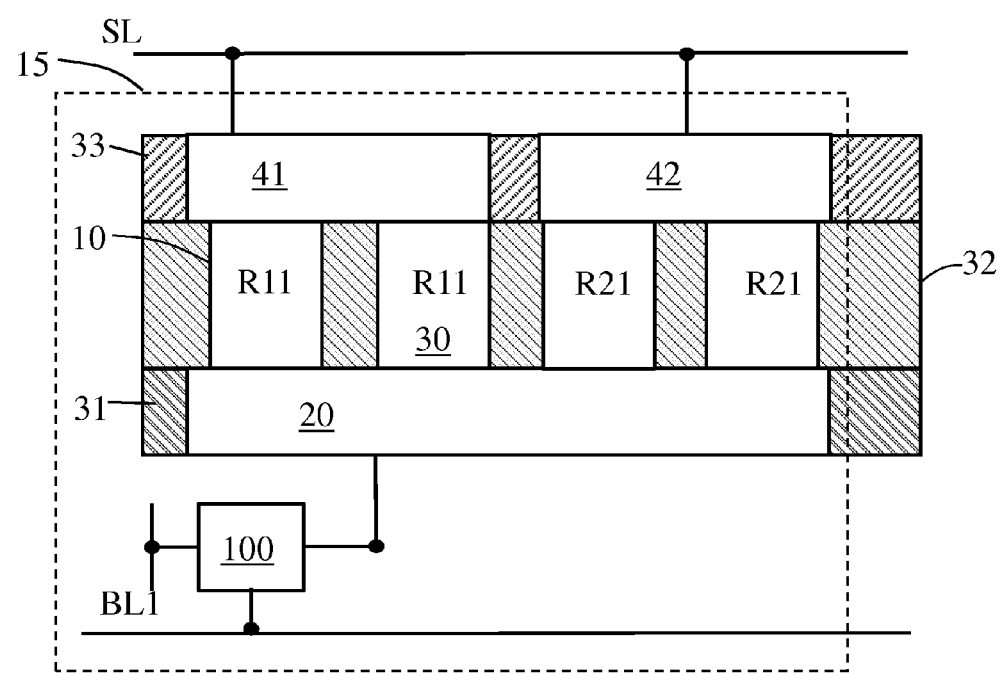
FIG. 12 illustrates a structural embodiment of a memory cell having both multi-bit operation and redundancy in accordance with an embodiment of the invention.

FIG. 12 illustrates a structural embodiment of a memory cell having both multi-bit operation and redundancy in accordance with an embodiment of the invention. FIG. 12 is a structural embodiment of the memory cell illustrated in FIG. 11.

Referring to FIG. 12, the at least two first memory unit R11 may be formed as described in FIG. 2 while the at least two second memory units R21 may be formed as described in FIGS. 10B-10E. For example, the second memory units R21 may be made to be different from the first memory unit R11 by changing the material of the second electrochemically active top electrode 42, adding an interfacial layer in the second electrochemically active top electrode 42, changing the thickness of the second electrochemically active top electrode 42, changing the material or thickness of the plurality of variable impedance regions 30 forming the second memory unit R21.

Figure 13:
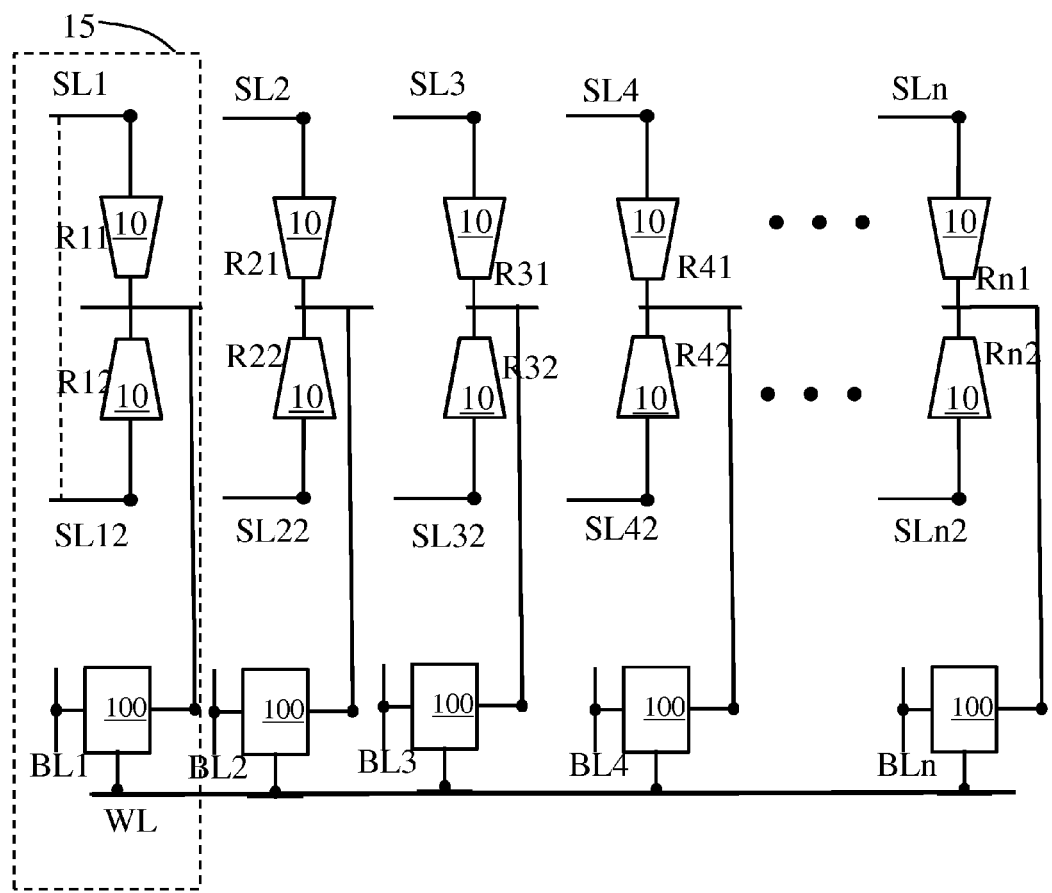
FIG. 13 illustrates a multi-bit memory cell array comprising normal and inverted cell architecture in an alternative embodiment of the invention.

FIG. 13 illustrates a multi-bit memory cell array comprising normal and inverted cell architecture in an alternative embodiment of the invention.

As illustrated in FIG. 13, each memory cell comprises a normal cell and an inverted cell coupled to an access device 100. Each memory of the plurality of memory units 10 is coupled to a separate select line. A first memory unit R11 of a first normal cell array may be coupled to a first select line SL1 and a first memory unit R12 of a second inverted cell array may be coupled to another first select line SL12. The first select line SL1 and the another first select line SL12 may be coupled together if the memory units are programmed in parallel. The first memory unit R11 of the first normal cell array may have different electrical behavior (e.g., threshold voltage, impedances, and others) than the first memory unit R12 of the second inverted cell array as described in FIGS. 9-10.

Similarly, a first adjacent memory cell 15 comprises a second memory unit R21 of the first normal cell array and a second memory unit R22 of the second inverted cell array. Another memory cell 15 comprises a third memory unit R31 of the first normal cell array and a third memory unit R32 of the second inverted cell array.

Figure 14:
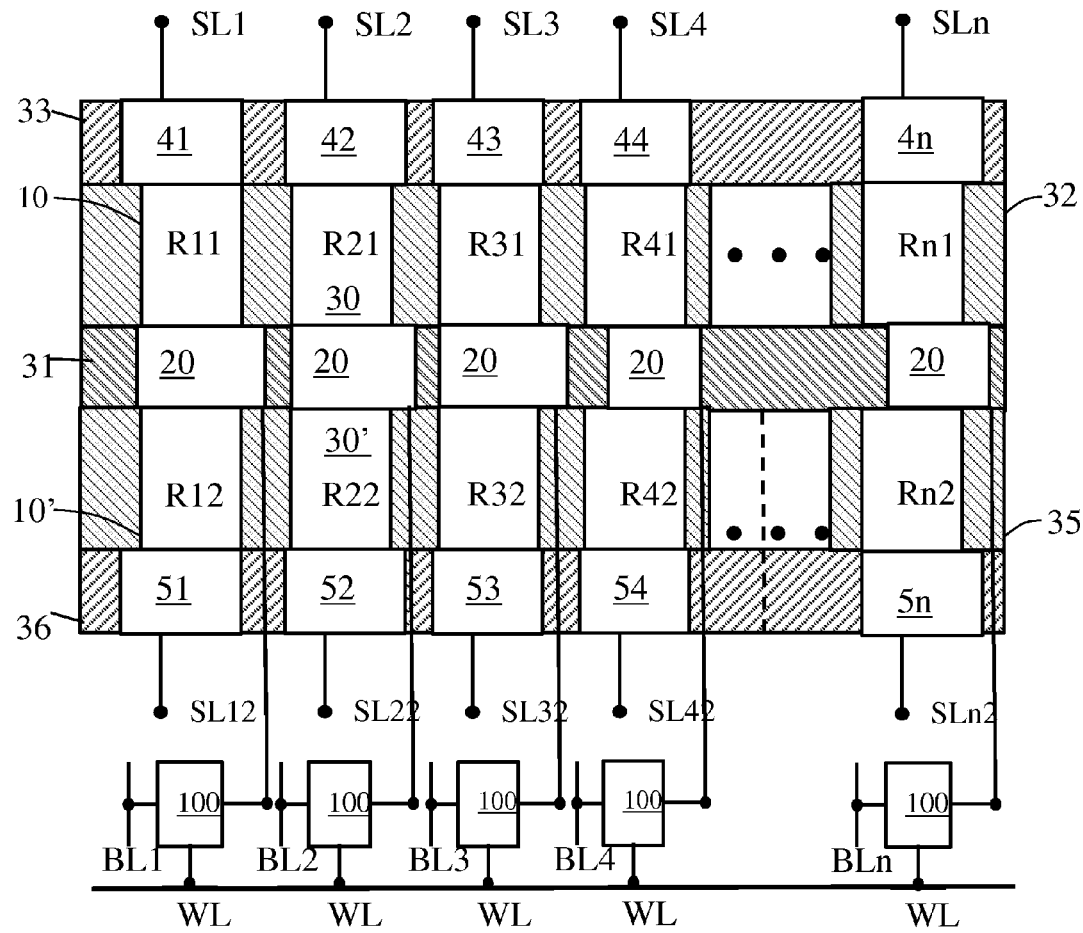
FIG. 14 illustrates a structural embodiment of a memory cell having both multi-bit operation using normal and inverted cell architecture in accordance with an embodiment of the invention.

FIG. 14 illustrates a structural embodiment of a memory cell having both multi-bit operation using normal and inverted cell architecture in accordance with an embodiment of the invention. FIG. 14 is a structural embodiment of the memory cell illustrated in FIG. 13.

Advantageously, the inverted cell and the normal cell may be made to have different electrical characteristics without introducing process complexity. As illustrated, the differences in the memory units are introduced into different levels of the memory cells thereby avoiding complex processes of masking and deposition etc., which are needed if memory unit having different impedances have to be formed in the same horizontal or lateral level.

Referring to FIG. 14, the memory cell comprises a first electrochemically active top electrode 41, a common first conductive layer 20, a first electrochemically active bottom electrode 51. A variable impedance region of a plurality of variable impedance region 30 embedded within the second insulating layer 32 is disposed between the first electrochemically active top electrode 41 and the first conductive layer 20 to form a first memory unit R11 of the first normal cell array. A variable impedance region of a second plurality of variable impedance region 30' embedded within a fourth insulating layer 35 is disposed between the first electrochemically active bottom electrode 51 and the first conductive layer 20 to form a first memory unit R12 of the second inverted cell array. Adjacent memory cells 15 are made similarly.

Figure 15:
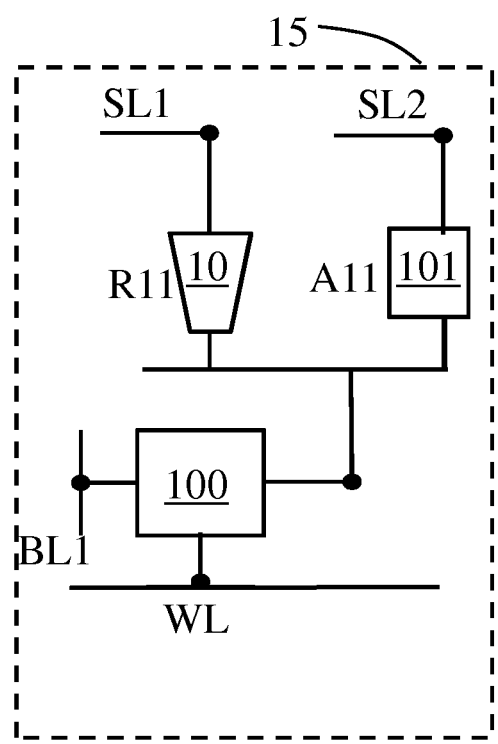
FIG. 15 illustrates a schematic of a multi-bit memory cell comprising at least two units in accordance with embodiments of the invention.

FIG. 15 illustrates a schematic of a multi-bit memory cell comprising at least two units in accordance with embodiments of the invention.

In various embodiments, the memory cell 15 may include different types of memory units. For example, the memory cell 15 may include a non-volatile memory unit and a volatile memory unit in one embodiment.

As illustrated in FIG. 15, the memory cell 15 may comprise a first memory unit R11 of a plurality of memory units 10 and another memory unit A11 of a plurality of different memory units 101. The plurality of different memory units 101 may be a two terminal, a three terminal, a four or higher terminal device in various embodiments.

In various embodiments, the first memory unit R11 of the plurality of memory units 10 and the another memory unit A11 of the plurality of different memory units 101 comprise an ionic device such as a programmable metallization cell. In one embodiment, the another type of memory unit A11 is a non volatile memory unit having performance characteristics of a conventional flash memory (a non volatile memory). In one embodiment, the another type of memory unit A11 is a non volatile memory unit having performance characteristics of a volatile memory. In an alternative embodiment, the another type of memory unit A11 is an one time programmable memory. In an alternative embodiment, the another type of memory unit A11 is a field programmable memory. In another embodiments, the another type of memory unit A11 is a logic unit. In one embodiment, both the first memory unit R11 and the another memory unit A11 may be coupled to a common access device 100. In one case, the first memory unit R11 and the another memory unit A11 may be coupled to different select lines SL1 and SL2.

In one embodiment, the different memory units of the memory cell 15 may share a common layer. For example, a first conductive layer 20 (as described previously) may be common between the first memory unit R11 and the another memory unit A11. In one case, the first conductive layer 20 may be formed as a continuous layer, a first portion of the continuous layer forming a part of the first memory unit R11 and a second portion of the continuous layer forming a part of the another memory unit A11.

Figure 16A:
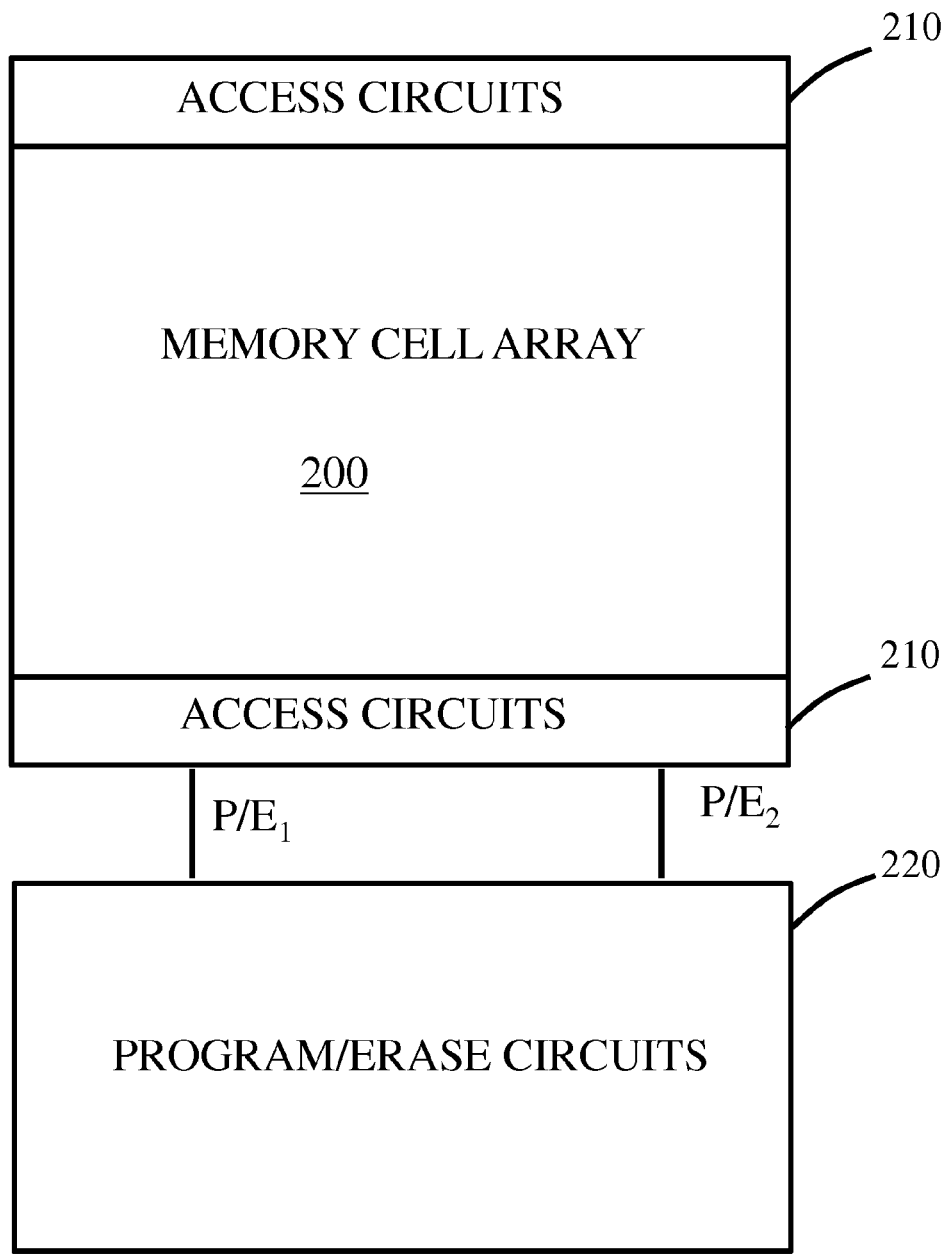
FIGS. 16A and 16B, illustrates a memory device implementing embodiments of the invention.
Figure 16B:
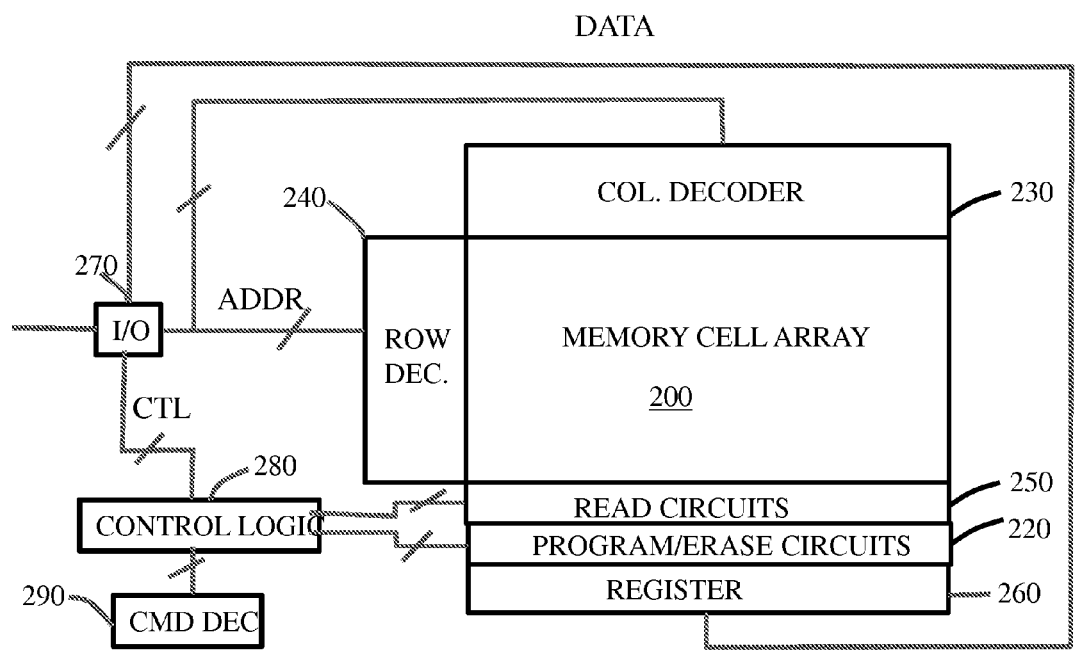

FIG. 16, which includes FIGS. 16A and 16B, illustrates a memory device implementing embodiments of the invention.

Referring to FIG. 16A, the memory device comprises a memory cell array 200 (e.g., as described in various embodiments previously), access circuits 210, and program/erase circuits 220. The memory cell array 200 may comprise a plurality of memory cells 15 having a plurality of memory units 10 and/or second plurality of memory units 10' as described previously. The access circuits 210 provide electrical connections to the memory cell array 200 so that the memory cells may be programmed, erased, and read. The access circuits 210 may be located on one or more sides of the memory cell array 200. For example, the access circuits 210 may be located on opposite sides such that the potential may be applied across the memory units. The access circuits 210 may comprise the word line, bit line, and select line drivers as an example.

The program and erase circuits 220 may provide program and erase signals (e.g., P/E$_1$, P/E$_2$) to the access circuits 210, which applies them to the memory cell array 200. The peak program or erase voltage may be higher than or lower than a supply voltage. The program and erase circuits may include charge pump circuits for generating higher than supply voltages, or step down voltage regulators and the like generating lower than supply voltages. The program and erase circuits may also receive one or more of the program and erase signals from an external circuit in some embodiments. In some embodiments, the program and erase circuits may comprise program circuits physically separate from the erase circuits.

FIG. 16B illustrates a further embodiment of the memory device. The memory device includes the program and erase circuits 220 and memory cell array 200 as described in FIG. 16A. The memory device may differ from the prior embodiment in that the access circuits may include a column decoder 230 and a row decoder 240. In response to an address data, the column and the row decoders 230 and 240 may select group of memory cells for reading, programming, erasing. Further, the memory device may comprise read circuits 250 separate from the program and erase circuits 220. The read circuits 250 may include current and/or voltage sense amplifiers. The memory device may further include a register 260 for storing read data values from the memory cell array 200 or to store data to be written into the memory cell array 200. In various embodiments, the register 260 may input and output data in parallel (i.e., bytes, words, and others). In some embodiments, the register 260 may be accessed by serial data paths.

Input/output (I/O) circuits 270 may receive address values and write data values, and output read data values. The received address values may be applied to column and row decoders 230 and 240 to select memory cells. Read data from the register 260 may be output over the I/O circuits 270. Similarly, write data on I/O circuits 270 may be stored in registers 260. A command decoder 290 may receive command data, which may be passed on to the control logic 280. The control logic 280 may provide signals to control various circuits of the memory device.

Figure 17:
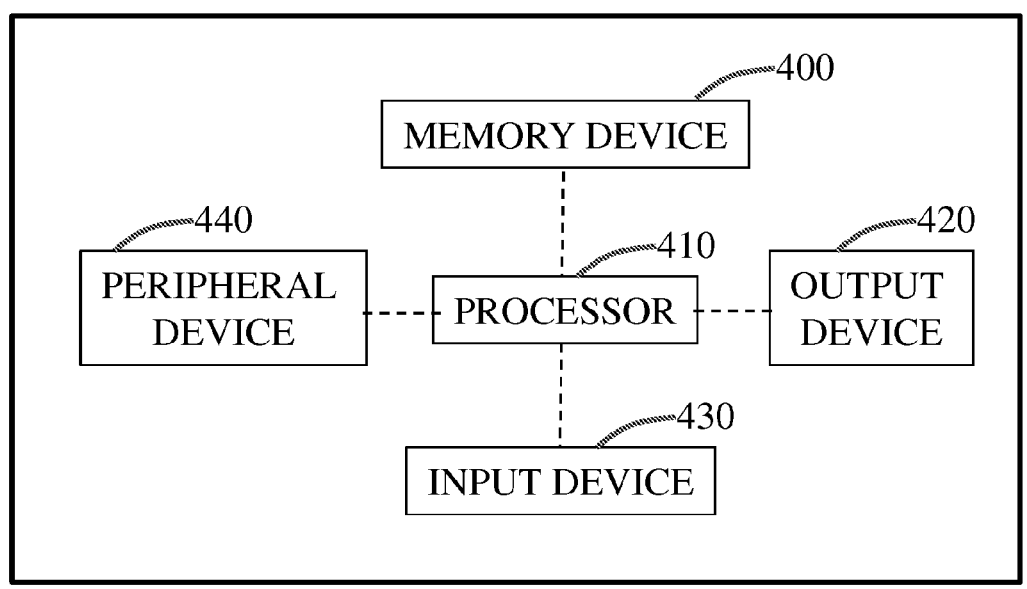
FIG. 17 illustrates a schematic block diagram of a system implementing embodiments of the invention.

FIG. 17 illustrates a schematic block diagram of a system implementing embodiments of the invention.

As illustrated in FIG. 17, the system may comprise the memory device 400 a processor 410, and output device 420, an input device 430, and optionally a peripheral device 450. The memory device 400 may be formed as described in FIG. 16 in one or more embodiments and may comprise a plurality of memory units.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. As an illustration, the embodiments described in FIGS. 1-15 may be combined with each other in various embodiments. It is therefore intended that the appended claims encompass any such modifications or embodiments.

Although the present invention and its advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A memory cell comprising:
a first resistive switching device having a first terminal and a second terminal;
a switching device having a first terminal and a second terminal; and
an access device having a first access terminal and a second access terminal, the first access terminal being coupled to the first terminal of the first resistive switching device and the first terminal of the switching device, wherein the memory cell is a memory having two-states comprising a high impedance state and a low impedance state, and wherein the first resistive switching device and the switching device provide redundancy to the memory cell.

2. The memory cell of claim 1, wherein the first resistive switching device is a different type of memory than the switching device.

3. The memory cell of claim 1, wherein the switching device is a second resistive switching device.

4. The memory cell of claim 3, wherein the first resistive switching device comprises a non volatile memory device, and wherein the second resistive switching device comprises an one time programmable memory device.

5. The memory cell of claim 3, wherein the first resistive switching device comprises a non volatile memory device, and wherein the second resistive switching device comprises a volatile memory device.

6. The memory cell of claim 3, wherein the first and the second resistive switching devices comprise programmable metallization cells.

7. The memory cell of claim 3, wherein the first and the second resistive switching devices comprise metal oxide based resistive memories.

8. The memory cell of claim 1, wherein the second terminal of the first resistive switching device and the second terminal of the switching device are coupled together.

9. The memory cell of claim 1, wherein the second access terminal is coupled to a bit line.

10. The memory cell of claim 1, wherein the access device comprises a transistor having a gate, a first source/drain coupled to the first access terminal and a second source/drain coupled to the second access terminal, wherein the gate is coupled to a word line, and wherein the second access terminal is coupled to a bit line.

11. A resistive switching device comprising:
a common electrode disposed within a first insulating layer;
a first variable impedance region disposed within a second insulating layer, the second insulating layer disposed over the first insulating layer;
a second variable impedance region disposed within the second insulating layer, the second variable impedance region separated from the first variable impedance region by a portion of the second insulating layer;
a first electrode disposed within a third insulating layer, the third insulating layer disposed over the second insulating layer, wherein the first and the second variable impedance regions are coupled between the first electrode and the common electrode; and
an output terminal of an access device coupled to the common electrode.

12. The device of claim 11, wherein the first electrode, the first variable impedance region, and the common electrode form a first memory unit, and wherein the first electrode, the second variable impedance region, and the common electrode form a second memory unit.

13. The device of claim 12, wherein the first memory unit has a ON state impedance different from the ON state impedance of the second memory unit.

14. The device of claim 12, wherein the first memory unit and the second memory unit provide redundancy to a memory cell comprising the first and the second memory units.

15. The device of claim 12, wherein the first memory unit and the second memory unit form a multi-bit memory cell.

16. The device of claim 11, further comprising:
a third variable impedance region disposed within a fourth insulating layer, the fourth insulating layer disposed under the first insulating layer;
a fourth variable impedance region disposed within the fourth insulating layer; and
a second electrode disposed under the third and the fourth variable impedance regions,
wherein the third and the fourth variable impedance regions are coupled between the second electrode and the common electrode.

17. The device of claim 16, wherein the second electrode is coupled to the first electrode.

18. The device of claim 11, wherein the device is an ionic memory, a metal oxide based memory, a phase change memory, or a logic cell unit.

19. A resistive switching device comprising:
a common electrode disposed within a first insulating layer;
a first variable impedance region disposed within a second insulating layer, the second insulating layer disposed over the first insulating layer;
a second variable impedance region disposed within the second insulating layer;
a first electrode disposed within a third insulating layer, the third insulating layer disposed over the second insulating layer; and
a second electrode disposed within the third insulating layer, wherein the first variable impedance region is coupled between the first electrode and the common electrode, and wherein the second variable impedance region is coupled between the second electrode and the common electrode.

20. The device of claim 19, wherein the first electrode is coupled to the second electrode.

21. The device of claim 19, wherein the first electrode is disposed between the common electrode and a substrate.

22. The device of claim 19, wherein the common electrode is disposed between the first electrode and a substrate.

23. The device of claim 22, further comprising:
a third variable impedance region disposed within a fourth insulating layer, the fourth insulating layer disposed under the first insulating layer;
a fourth variable impedance region disposed within the fourth insulating layer;
a third electrode disposed within a fifth insulating layer under the third variable impedance region, wherein the third variable impedance region is coupled between the third electrode and the common electrode; and
a fourth electrode disposed within the fifth insulating layer under the fourth variable impedance region, wherein the fourth variable impedance region is coupled between the fourth electrode and the common electrode.

24. The device of claim 19, wherein the first electrode, the first variable impedance region, and the common electrode form a first memory unit, and wherein the second electrode, the second variable impedance region, and the common electrode form a second memory unit.

25. The device of claim 24, wherein the first memory unit has a ON state impedance different from the ON state impedance of the second memory unit.

26. The device of claim 19, further comprising:
- a third variable impedance region disposed within the second insulating layer, wherein the third variable impedance region is coupled between the first electrode and the common electrode; and
- a fourth variable impedance region disposed within the second insulating layer, wherein the fourth variable impedance region is coupled between the second electrode and the common electrode.

* * * * *